(12) United States Patent
Yamaguchi et al.

(10) Patent No.: US 10,490,405 B2
(45) Date of Patent: Nov. 26, 2019

(54) SEMICONDUCTOR DEVICE MANUFACTURING METHOD, SUBSTRATE PROCESSING APPARATUS AND VACUUM PROCESSING APPARATUS

(71) Applicant: TOKYO ELECTRON LIMITED, Tokyo (JP)

(72) Inventors: Tatsuya Yamaguchi, Nirasaki (JP); Reiji Niino, Nirasaki (JP); Hiroyuki Hashimoto, Nirasaki (JP); Syuji Nozawa, Nirasaki (JP); Makoto Fujikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/910,463

(22) Filed: Mar. 2, 2018

(65) Prior Publication Data

US 2018/0261458 A1    Sep. 13, 2018

(30) Foreign Application Priority Data

Mar. 10, 2017    (JP) .................................. 2017-046467

(51) Int. Cl.
*H01L 21/033*    (2006.01)
*H01L 21/027*    (2006.01)
*H01L 21/265*    (2006.01)
*H01L 21/677*    (2006.01)
*H01L 21/67*    (2006.01)
(Continued)

(52) U.S. Cl.
CPC .......... *H01L 21/0337* (2013.01); *H01J 37/00* (2013.01); *H01L 21/02057* (2013.01); *H01L 21/0271* (2013.01); *H01L 21/033* (2013.01); *H01L 21/0332* (2013.01); *H01L 21/266* (2013.01); *H01L 21/26513* (2013.01); *H01L 21/6715* (2013.01); *H01L 21/6719* (2013.01); *H01L 21/67034* (2013.01);
(Continued)

(58) Field of Classification Search
None
See application file for complete search history.

(56) References Cited

U.S. PATENT DOCUMENTS 3,607,365 A * 9/1971 Lindlof ...................... B01J 8/44
427/213
5,851,261 A * 12/1998 Markusch ............ C05G 3/0029
71/64.07
(Continued)

FOREIGN PATENT DOCUMENTS

JP            2016-51094 A    4/2016

*Primary Examiner* — Anthony Ho
*Assistant Examiner* — Kevin Quinto
(74) *Attorney, Agent, or Firm* — Nath, Goldberg & Meyer; Jerald L. Meyer

(57) ABSTRACT

There is provided a semiconductor device manufacturing method including: forming a first mask film composed of a polymer having a urea bond by supplying a raw material to a surface of the substrate for polymerization; forming a second mask inorganic film to be laminated on the first mask film; forming a pattern on the first mask film and the second mask inorganic film and performing an ion implantation on the surface of the substrate; removing the second mask inorganic film after the ion implantation; and removing the first mask film by heating the substrate after the ion implantation and depolymerizing the polymer.

10 Claims, 17 Drawing Sheets

(51) Int. Cl.
*H01L 21/02* (2006.01)
*H01J 37/00* (2006.01)
*H01L 21/266* (2006.01)
*H01L 29/78* (2006.01)

(52) U.S. Cl.
CPC .. *H01L 21/67063* (2013.01); *H01L 21/67213* (2013.01); *H01L 21/67703* (2013.01); *H01L 29/785* (2013.01)

(56) References Cited

U.S. PATENT DOCUMENTS

2005/0227482 A1* 10/2005 Korzenski .............. C11D 3/042
  438/639
2007/0218387 A1* 9/2007 Ishii .................. G03G 9/09708
  430/108.7

* cited by examiner

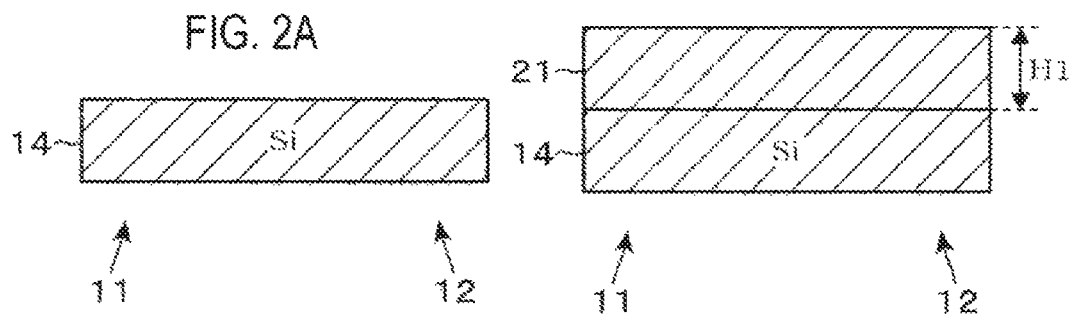
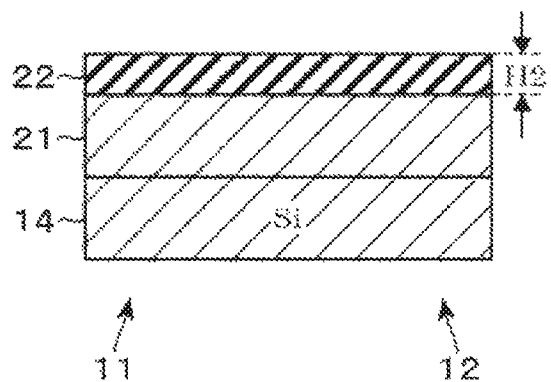

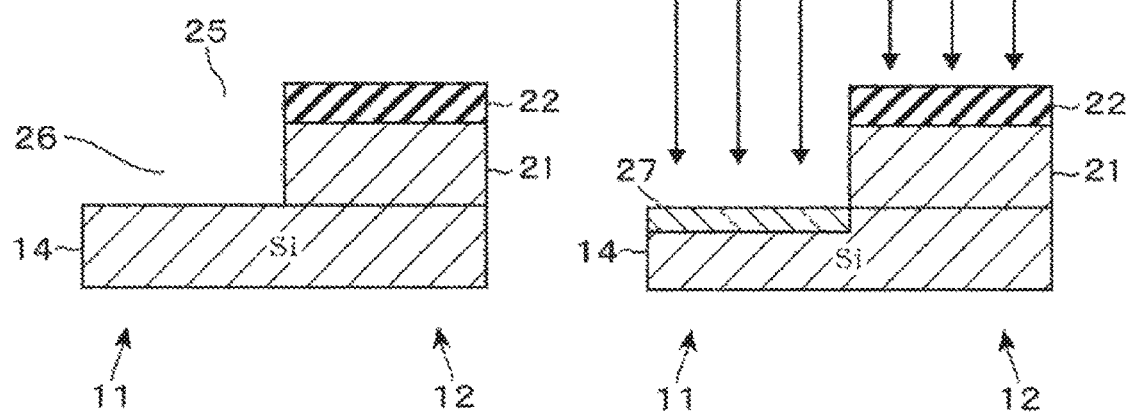
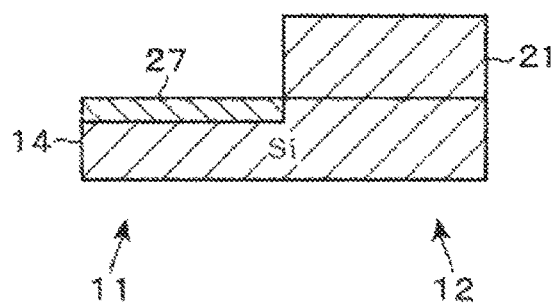

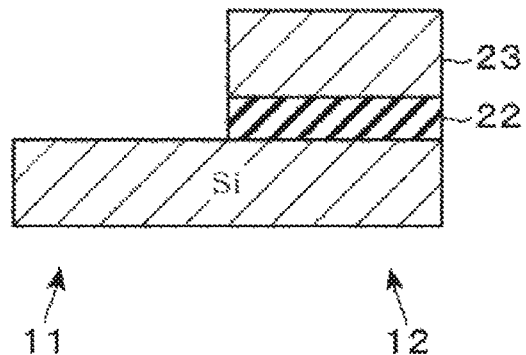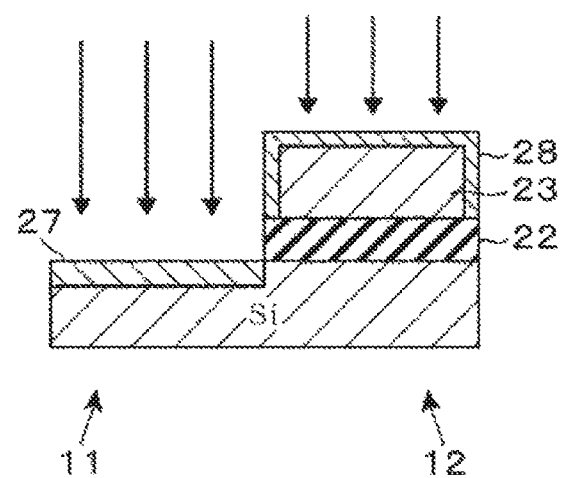

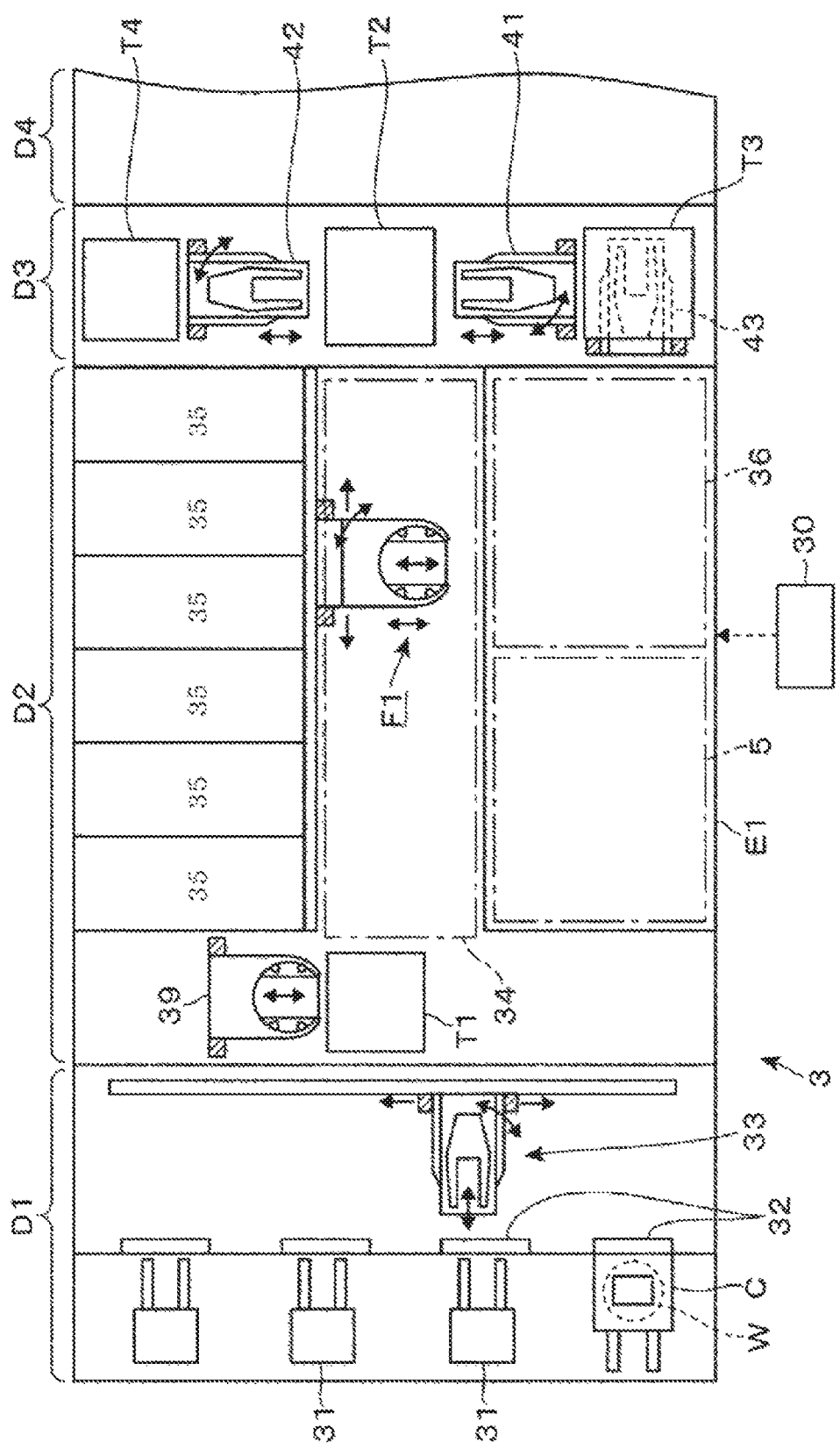

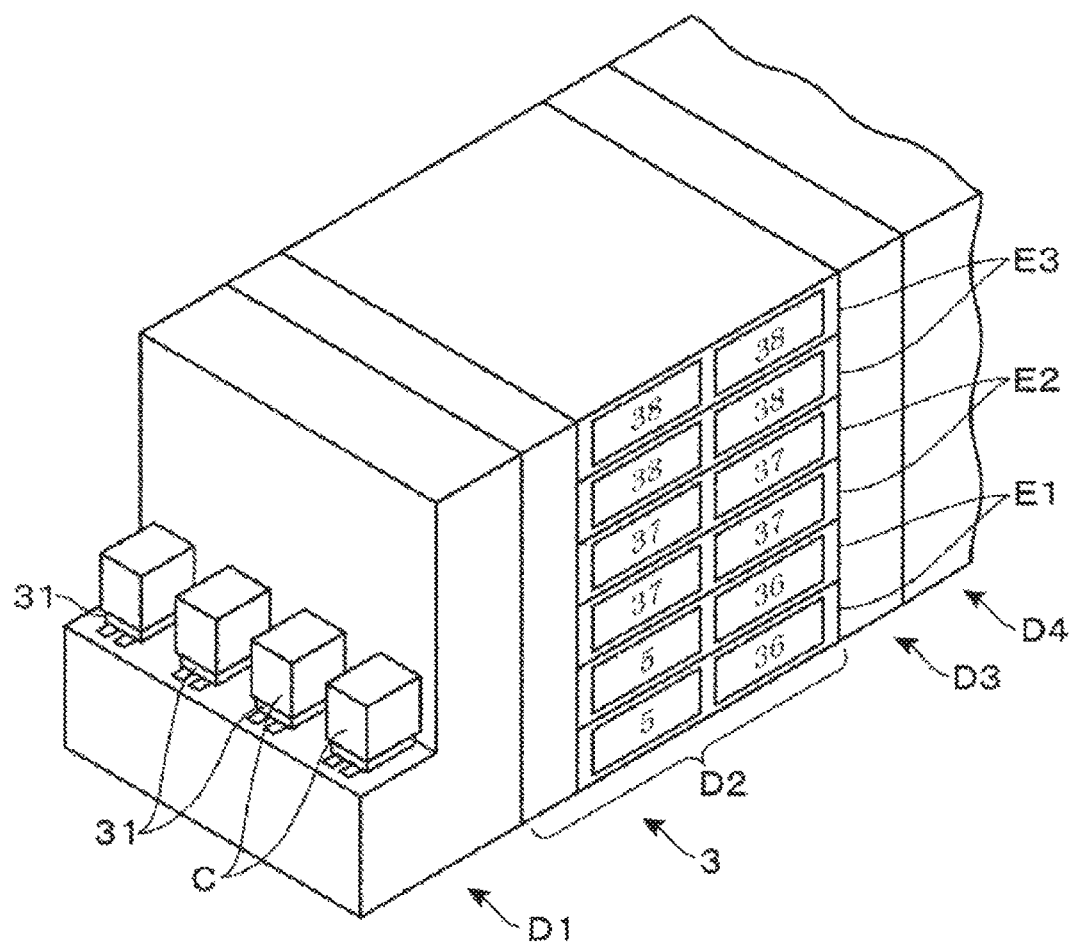

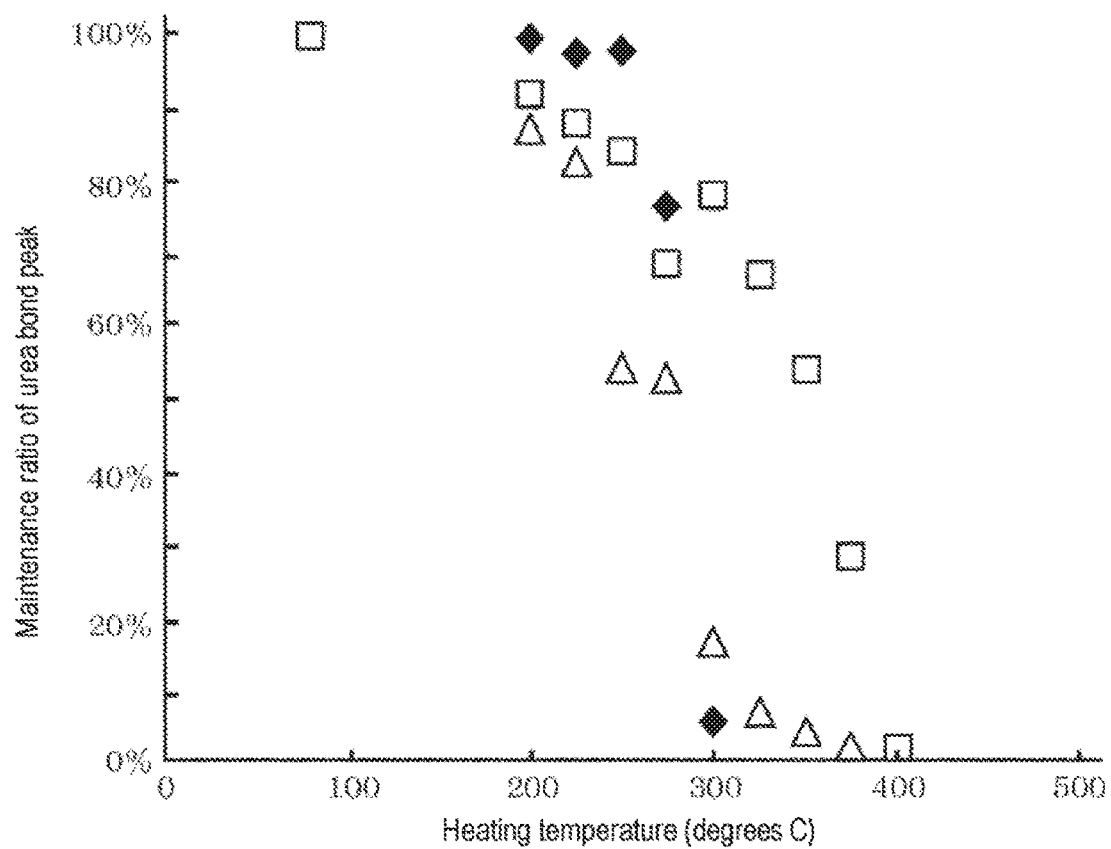

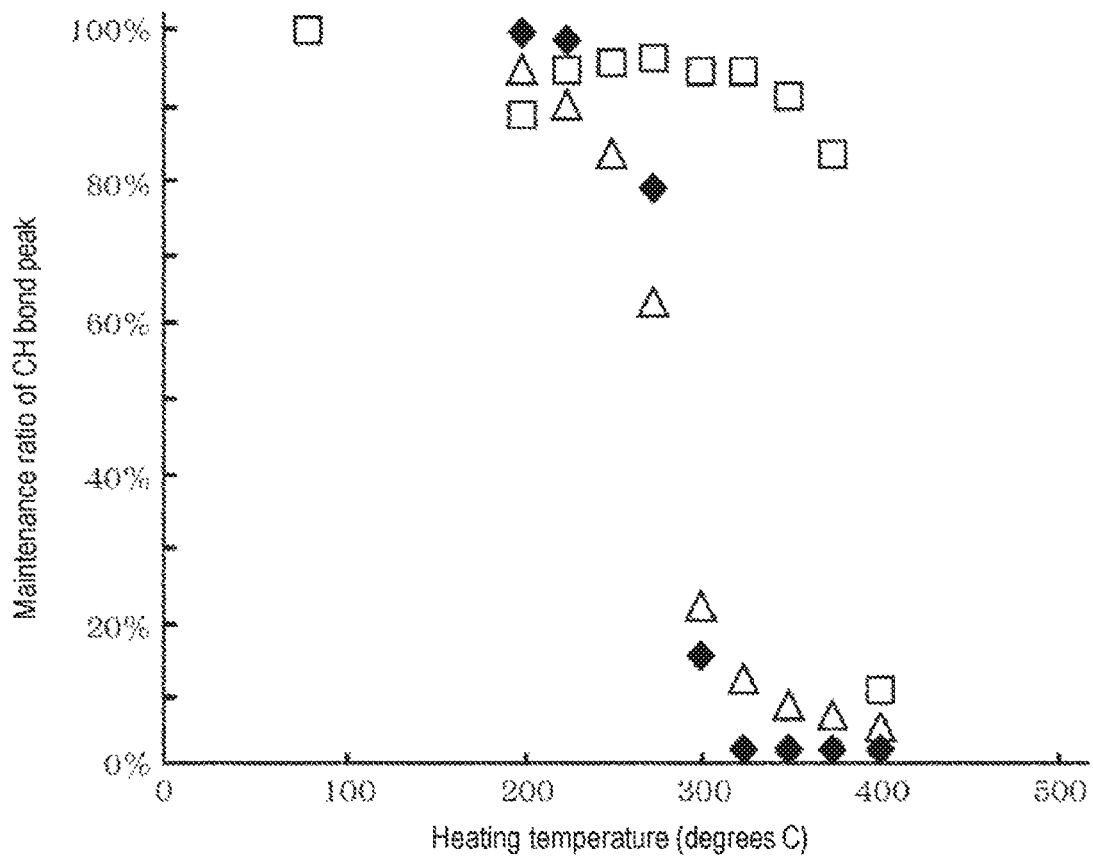

SEMICONDUCTOR DEVICE MANUFACTURING METHOD, SUBSTRATE PROCESSING APPARATUS AND VACUUM PROCESSING APPARATUS

CROSS-REFERENCE TO RELATED APPLICATION

This application is based upon and claims the benefit of priority from Japanese Patent Application No. 2017-046467, filed on Mar. 10, 2017, the entire contents of which are incorporated herein by reference.

TECHNICAL FIELD

The present disclosure relates to a technique for forming a mask on a substrate for the manufacture of a semiconductor device and performing ion implantation.

BACKGROUND

In a manufacturing process of a semiconductor device, ion implantation is performed on a semiconductor wafer (hereinafter referred to as a wafer) which is a substrate. This ion implantation is carried out, for example, in a state in which a mask made of a resist film is formed. The mask is removed after the ion implantation. For example, a mask for ion implantation and a method for removing the mask have been used.

As will be described in the Detailed Description section below, the aforementioned ion implantation turns the surface of a resist film, which is an organic film, into a carbonized layer having a relatively high hardness. Along with the miniaturization of wiring of a semiconductor device, there is a case where the resist film is formed to have unevenness. In that case, the aforementioned carbonized layer is also formed on the side surface of the resist film in addition to the upper surface thereof. That is to say, there is a tendency that the amount of the carbonized layer formed on the wafer increases. In order to remove the carbonized layer at the time of removing the resist film it is conceivable to perform a process (ashing) of supplying an oxygen gas in a plasma state, a process of supplying a high-temperature cleaning solution or a chemical solution having a relatively high polarity, a process of supplying an ozone gas, or the like. In either case, there is a concern that the ion implantation region which is not covered with the resist film is damaged. In addition, there is a concern that by performing the aforementioned processes, the carbonized layer is ruptured to generate particles. Since the amount of formation of the carbonized layer tends to increase as described above, there is a concern that the influence of the particles becomes large.

Therefore, a technique for performing ion implantation while preventing the formation of the carbonized layer is required. In the aforementioned removal method, a silicon-containing film is formed as a mask for ion implantation. After the ion implantation, the wafer is dipped in a mask stripping solution to remove the mask. However, in order to perform such a process, it is necessary to transfer a substrate from a vacuum atmosphere in which ion implantation is performed to an atmospheric pressure atmosphere for performing liquid processing. In this case, the number of steps increases and the cost grows higher. Moreover, the transfer of the substrate is inefficient.

SUMMARY

Some embodiments of the present disclosure provide a technique capable of preventing damage to a substrate when performing implantation of ions into a substrate using a mask and removing the mask after the ion implantation.

According to one embodiment of the present disclosure, there is provided a semiconductor device manufacturing method including: forming a first mask film composed of a polymer having a urea bond by supplying a raw material to a surface of the substrate for polymerization; forming a second mask inorganic film to be laminated on the first mask film; forming a pattern on the first mask film and the second mask inorganic film and performing an ion implantation on the surface of the substrate; removing the second mask inorganic film after the ion implantation; and removing the first mask film by heating the substrate after the ion implantation and depolymerizing the polymer.

According to another embodiment of the present disclosure, there is provided a substrate processing apparatus, including: a first film forming part configured to form a first mask film composed of a polymer having a urea bond on a surface of a substrate; a second film forming part configured to form a second mask inorganic film so as to be laminated on the first mask film; a third film forming part configured to form a resist film so as to be laminated on the second mask inorganic film; a heating part configured to heat the substrate after the resist film is exposed; a developing part configured to develop the heated substrate; and a transfer mechanism configured to transfer the substrate between respective parts for processing the substrate, wherein the first film forming part includes a mounting table on which the substrate is mounted, and a raw material discharge part configured to supply a polymerization liquid to the substrate mounted on the mounting table.

According to another embodiment of the present disclosure, there is provided a vacuum processing apparatus, including: an ion implantation module configured to implant, in a vacuum atmosphere, ions into a substrate in which a first mask film composed of a polymer having a urea bond and a second mask inorganic film laminated on the first mask film are formed and in which a mask pattern is formed on each of the first mask film and the second mask inorganic film; an etching processing module configured to supply an etching gas to the substrate to remove the second mask inorganic film in the vacuum atmosphere after the ion implantation; and a removal module configured to remove the first mask film by heating the substrate in the vacuum atmosphere, after the ion implantation, and depolymerizing the polymer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A to 2C are explanatory views showing some steps of a semiconductor device manufacturing method according to an embodiment of the present disclosure.

FIGS. 4G to 4I are explanatory views showing some steps of a semiconductor device manufacturing method according to an embodiment of the present disclosure.

FIGS. 7A and 7/b are explanatory views showing some steps of a semiconductor device manufacturing method according to a comparative example.

FIG. 9 is a plan view of a coating/developing apparatus for carrying out the semiconductor device manufacturing method.

FIG. 10 is a perspective view of the coating/developing apparatus.

FIG. 17 is a graph showing the results of evaluation tests.

FIG. 18 is a graph showing the results of evaluation tests.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
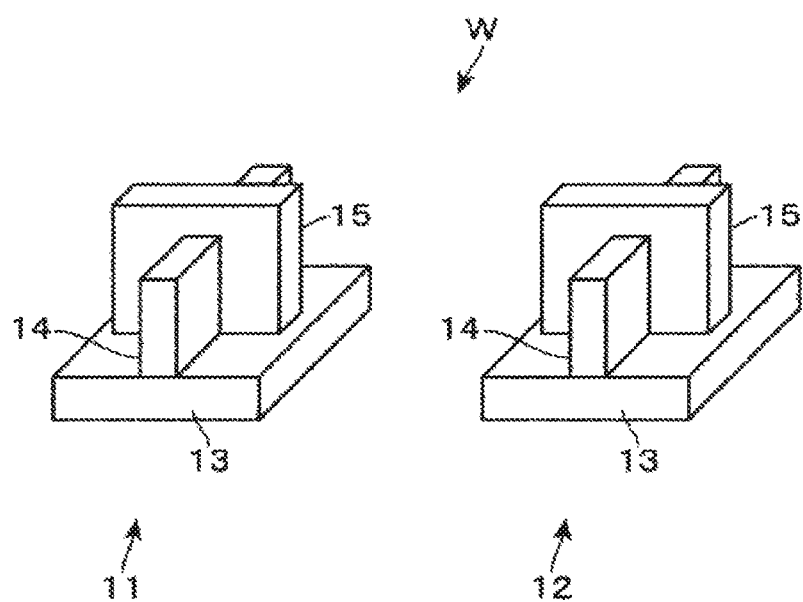
FIG. 1 is a schematic perspective view showing the surface of a wafer.

An embodiment in which a semiconductor device manufacturing method according to the present disclosure is applied to a process for manufacturing a Fin-FET which is one type of MOSFET (Metal-Oxide-Semiconductor Field-Effect Transistor) as a semiconductor device will be described. FIG. 1 shows a p-MOS formation region 11 and an n-MOS formation region 12 formed on the surface of a wafer W which is a substrate. Each of the formation regions 11 and 12 includes a silicon (Si) layer 13, a Si layer 14 which projects upward from the Si layer 13 and extends in the lateral direction, and a rectangular gate 15 which covers a longitudinal center portion of the Si layer 14 and extends in the lateral direction on the Si layer 13 so as to be orthogonal to the direction in which the Si layer 14 extends.

More specifically, the process to be described below is a process in which B (boron) ions as p-type impurities are implanted into the Si layer 14 of the p-MOS formation region 11 in a state in which the Si layer 14 of the n-MOS formation region 12 is masked. The process from the formation of the mask to the removal of the mask will be described with reference to FIGS. 2A to 5J. FIGS. 2A to 5J show the vertical sectional side surfaces of the Si layers 14 of the formation regions 11 and 12. As shown in FIG. 1, the respective Si layers 14 of the formation regions 11 and 12 are formed to be spaced apart from each other in the lateral direction. However, in order to simplify the illustration, in FIGS. 2A to 5J, the respective Si layers 14 are shown as if they are adjacent to each other in the left-right direction. It is assumed that in each figure, the Si layer 14 in the p-MOS formation region 11 is located on the left side with respect to the left-right center, and the Si layer 14 in the n-MOS formation region 12 is located on the right side with respect to the left-right center.

Figure 6:
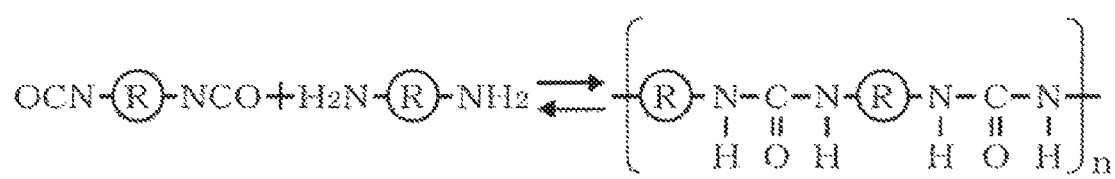
FIG. 6 is an explanatory view showing how a polymer having a urea bond is produced by a copolymerization reaction.

First, a polyurea film 21 which is a first mask film is formed so as to be laminated on the Si layer 14 (FIGS. 2A and 2B). As shown by way of example as a chemical reaction formula proceeding toward the right side in FIG. 6, the polyurea film 21 may be formed by copolymerizing isocyanate and amine, which are raw material monomers, so as to form a urea bond. In FIG. 6, diisocyanate is shown as an example of isocyanate and diamine is shown as an example of amine. In FIG. 6, R is, for example, an alkyl group (linear alkyl group or cyclic alkyl group) or an aryl group, and n is an integer of 2 or more. In addition, the film thickness of the polyurea film 21 indicated by H1 in FIG. 2B is, for example, 500 nm to 1,000 nm.

As the amine which is a raw material monomer, for example, an alicyclic compound or an aliphatic compound may be used. Examples of the alicyclic compound may include 1,3-bis (aminomethyl) cyclohexane ($H_6XDA$). Examples of the aliphatic compound may include 1,12-diaminododecane (DAD). As the isocyanate which is a raw material monomer, for example, an alicyclic compound, an aliphatic compound, an aromatic compound or the like may be used. Examples of the alicyclic compound may include 1,3-bis (isocyanate methyl) cyclohexane ($H_6XDI$). Examples of the aliphatic compound may include hexamethylene diisocyanate.

After forming the polyurea film 21, an inorganic film 22 which is a second mask film is formed so as to be laminated on the polyurea film 21 (FIG. 2C). The inorganic film 22 is, for example, a film containing Si as a main component. More specifically, the inorganic film 22 is composed of, for example, a SiOC (silicon oxide added with carbon) film, a SiN (silicon nitride) film, a $SiO_2$ (silicon oxide) film, or the like. The inorganic film 22 together with the polyurea film 21 serves not only as a mask at the time of ion implantation but also as an anti-reflection film. The inorganic film 22 may be formed by, for example, CVD (Chemical Vapor Deposition), or may be formed by supplying a chemical solution to the wafer W as described later. The film thickness of the inorganic film 22 indicated by H2 in FIG. 2C is smaller than the film thickness of the polyurea film 21 and is, for example, 10 nm to 50 nm.

Figure 3D:
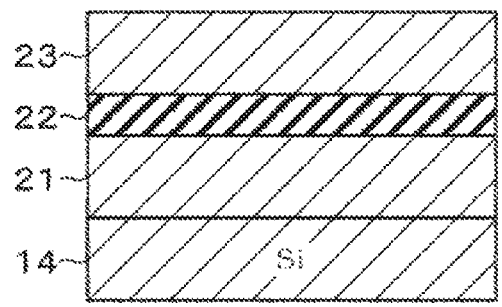
FIGS. 3D to 3F are explanatory views showing some steps of a semiconductor device manufacturing method according to an embodiment of the present disclosure.
Figure 3E:
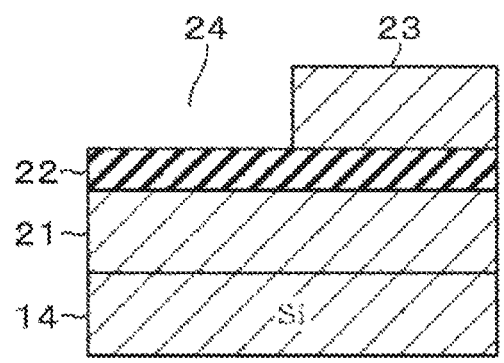

Subsequently, a resist film 23 is formed so as to be laminated on the inorganic film 22 (FIG. 3D). Then, by exposing and developing the resist film 23, an opening 24 is formed in a portion of the resist film 23 corresponding to the p-MOS formation region 11. That is to say, a resist pattern (mask pattern) is formed (FIG. 3E). Thereafter, by using the resist film 23 as a mask, the inorganic film 22 is etched (FIG. 3F), whereby an opening 25 forming a mask pattern is formed in the inorganic film 22. This etching is performed, for example, by supplying an etching gas to the wafer W. For example, when the inorganic film 22 is a SiOC film or a SiN film as described above, a CF-based gas such as a $CF_4$ (carbon tetrafluoride) gas or the like may be used as an etching gas.

Using the inorganic film 22 as a mask, the polyurea film 21 is etched to form an opening 26 forming a mask pattern in the polyurea film 21, and the resist film 23 is removed (FIG. 4G). This etching is performed, for example, by using an $O_2$ (oxygen) gas as an etching gas and converting the $O_2$ gas into plasma. Subsequently, B (boron) ions are implanted into the surface of the Si layer 14 in the p-MOS formation region 11 by using the inorganic film 22 and the polyurea film 21 as a mask, whereby an ion implantation region 27 is formed (FIG. 4H). Thereafter, the inorganic film 22 is etched and removed (FIG. 4I). This etching is performed, for example, by supplying an etching gas to the wafer W. When the inorganic film 22 is a SiOC film or a SiN film as described above, a CF-based gas may be used as an etching gas.

Figure 5J:
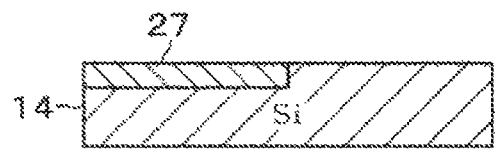
FIG. 5J is an explanatory view showing a step of a semiconductor device manufacturing method according to an embodiment of the present disclosure.

Thereafter, the polyurea film 21 is removed by heating (FIG. 5J). More specifically, when polyurea is heated to 300 degrees C. or higher, for example, 350 degrees C. the urea bond in the polyurea is broken and the polyurea is depolymerized to amine and isocyanate which are raw material monomers. Accordingly, the chemical reaction toward the left side in FIG. 6 proceeds. Depolymerized amine and isocyanate are diffused from the wafer W and are removed.

In order not to adversely affect the element portion already formed on the wafer W, the heating for removing the polyurea film 21 may be performed at, for example, 450 degrees C. or lower. The heating atmosphere is, for example, an inert gas atmosphere such as an $N_2$ (nitrogen) gas atmosphere or the like. Since the polyurea film 21 is depolymerized by heat in this way, each process after the formation of the polyurea film 21 and before the depolymerization is performed at a temperature at which the polyurea film 21 does not disappear by the depolymerization, for example, at a temperature of 200 degrees C. or lower.

In order to explain the effects of the semiconductor device manufacturing method according to the embodiment of the present disclosure described with reference to FIGS. 2A to 5J, a semiconductor device manufacturing method according to a comparative example will be described with reference to FIGS. 7A and 7B. The method according to the comparative example differs from the semiconductor device manufacturing method according to the embodiment of the present disclosure in terms of the material of the mask formed on the Si layer 14 in the n-MOS formation region 12. The mask is composed of an inorganic film 22 and a resist film 23 laminated in the named order from the lower side (FIG. 7A). When ion implantation is performed to form an ion implantation region 27, the bond of hydrogen and carbon is broken on the surface of the resist film 23 which is an organic film and the hydrogen is removed, whereby the carbonized layer 28 as described in the Background section of the present disclosure is formed (FIG. 7B). If a process of applying relatively large energy to the wafer W, such as ashing or the like, is performed to remove the carbonized layer 28 together with the resist film 23, the unmasked ion implantation region 27 may be damaged. In addition, there is a concern that due to such processing, the carbonized layer 28 ruptures and breaks into particles.

On the other hand, according to the semiconductor device manufacturing method of the embodiment of the present disclosure described with reference to FIGS. 2A to 5J, ions are implanted into the Si layer 14 by using the polyurea film 21 and the inorganic film 22 laminated on the polyurea film 21 as a mask. If the mask is constituted only by the polyurea film 21 without forming the inorganic film 22, since the polyurea film 21 is an organic film, the aforementioned carbonized layer may be formed by ion implantation just like the resist film. As described above, the formation of the carbonized layer 28 is prevented by forming the inorganic film 22 on the polyurea film 21 at the time of ion implantation. The polyurea film 21 can be removed by heating the wafer W. Accordingly, there is no need to expose the wafer W to a harsh environment (environment in which large energy is applied) such as removal of the carbonized layer 28. Thus, it is possible to suppress damage to the ion implantation region 27. This makes it possible to suppress damage to a Fin-FET which is a semiconductor device, and to enhance the reliability of the Fin-FET. Further, it is possible to prevent generation of particles due to rupture of the carbonized layer 28. When ions are implanted into the Si layer 14 in the p-MOS formation region 11, the gate 15 of the formation region 11 is also exposed. Thus, the gate 15 is damaged by ion implantation. However, the gate 15 is a temporary structure and is removed later. Thereafter, an original gate is formed.

Incidentally, since the inorganic film 22 is harder than an organic film, it is difficult to remove the inorganic film 22. That is to say, if the film thickness of the inorganic film 22 is increased, the period of time required for removal thereof becomes long, and the throughput may decrease. Thus, it is preferable to reduce the film thickness of the inorganic film 22. However, if the inorganic film 22 having such a relatively small film thickness is directly laminated on the Si layer 14, ions pass through the inorganic film 22. Thus, the ions are also implanted into the n-MOS formation region 12. Therefore, by forming the polyurea film 21 under the inorganic film 22 and forming the mask with the inorganic film 22 and the polyurea film 21, it is possible to secure the film thickness of the mask required for preventing ion implantation into the n-MOS formation region 12. In order to reliably secure the role as a mask in this way and to reliably prevent a reduction in throughput, the film thickness of the polyurea film 21 and the film thickness of the inorganic film 22 are respectively set as described above. Furthermore, polyurea contains an amide group. A hydrogen bond is formed between an amide group constituting one polymer and an amide group constituting the other polymer. Therefore, the polyurea film 21 has a relatively high chemical resistance and a practically sufficient heat resistance of about 200 degrees C. In other words, the polyurea film 21 has properties suitable as a mask.

Figure 8A:
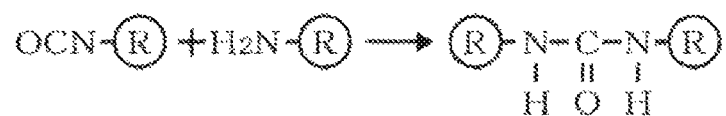
FIGS. 8A and 8B are explanatory views showing a reaction of forming a urea film.
Figure 8B:
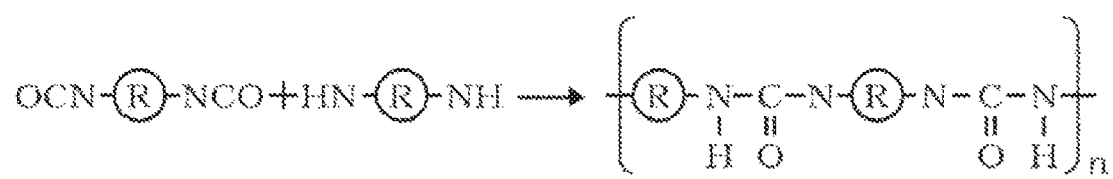

FIGS. 8A and 8B show examples of raw material monomers other than those shown in FIG. 6. The urea film formed as a mask on the wafer W is not limited to being a polymer compound like the polyurea film 21 but may be an oligomer. A urea film having a urea bond may be formed by using amine and isocyanate as raw material monomers from which the oligomer is formed as shown in FIG. 8A. Furthermore, as shown in FIG. 8B, isocyanate and secondary amine may be used as raw material monomers. The bond contained in the polymer produced in this case is a urea bond. In some embodiments, the molecular weight of the functional group R shown in FIGS. 8A, 8B and 6 may be 200 or less in order to vaporize the raw material monomers depolymerized by heating as described above and to remove the raw material monomers from the wafer W.

Figure 11:
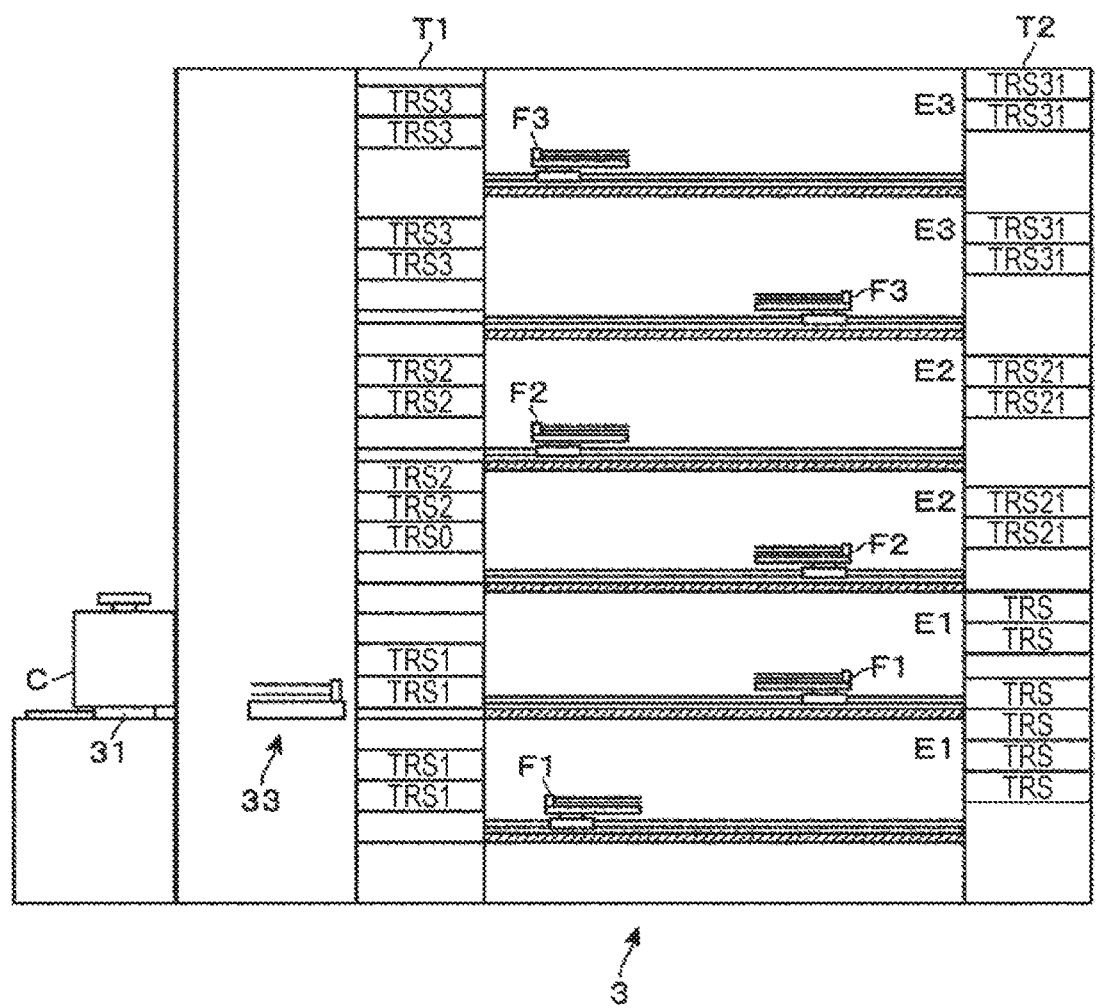
FIG. 11 is a vertical sectional side view of the coating/developing apparatus.

Next, a coating/developing apparatus 3 which is a substrate processing apparatus for performing a series of processes from the formation of the polyurea film 21 to the formation of the resist pattern described in FIGS. 2A to 3E will be described with reference to FIGS. 9 to 11. FIGS. 9, 10 and 11 are a plan view, a perspective view and a schematic vertical side view of the coating/developing apparatus 3. Each process in the coating/developing apparatus 3 is performed in an atmospheric pressure atmosphere.

The coating/developing apparatus 3 includes a carrier block D1, a processing block D2 and an interface block D3, which are linearly connected in the lateral direction. An exposure apparatus D4 is connected to the interface block D3. In the following description, the arrangement direction of the blocks D1 to D3 refers to a front-rear direction. The carrier block D1 includes mounting tables 31 for carriers C, opening/closing portions 32 provided in the front of the carriers C mounted on the mounting tables 31 and opened and closed together with lids of the carriers C, and a transfer mechanism 33 configured to transfer a wafer W between the inside of the carriers C and the inside of the carrier block D1 via the opening/closing portions 32.

The processing block D2 is configured by stacking six unit blocks E for performing liquid processing on the wafer W sequentially from the bottom. As the six unit blocks E, three kinds of unit blocks E1 to E3 are provided in two layers, respectively. The same unit blocks are configured in the same manner, and the same processing is performed in the same unit blocks. In each unit block E, the transfer and processing of the wafer W are performed independently of each other.

The unit block E1 shown in FIG. 9 will be described. A transfer region 34 for the wafer W is provided between the carrier block D1 and the interface block D3. At one side of the left and right sides of the transfer region 34, a plurality of heating modules 35 as heating parts is provided along the front-rear direction. At the other side of the left and right sides of the transfer region 34, a polyurea film forming module 5 as a first film forming part and an inorganic film forming module 36 as a second film forming part for forming an inorganic film 22 are provided along the front-rear direction. The polyurea film forming module 5 is a module that forms a polyurea film 21 by applying a chemical solution to the surface of the wafer W. The configuration of the polyurea film forming module 5 will be described later in detail. The inorganic film forming module 36 is a module that coats a chemical solution for forming the inorganic film 22 on the surface of the wafer W. In the transfer region 34, a transfer arm F as a transfer mechanism for the wafer W is provided.

The unit block E2 has the same configuration as that of the unit block E1 except that instead of the polyurea film forming module 5 and the inorganic film forming module 36, two resist film forming modules 37 are provided as third film forming parts. The resist film forming modules 37 are modules for forming a resist film 23 by coating a resist as a chemical solution on the surface of the wafer W.

The unit block E3 is configured in the same manner as the unit block E1 except that instead of the polyurea film forming module 5 and the inorganic film forming module 36, two developing modules 38 are provided. The developing modules 38 supply a developing solution as a chemical solution to the surface of the wafer W to develop the resist film 23, thereby forming a resist pattern. Transfer arms corresponding to the transfer arm F1 of the unit block E1 and provided in the unit blocks E2 and E3 are denoted by F2 and F3, respectively. The heating module 35 provided in the unit block E2 is configured as a pre-exposure heating part for thermally processing the wafer W coated with a resist. The heating module 35 provided in the unit block E3 is configured as a post-exposure heating part for heating the wafer W subjected to exposure.

At the side of the carrier block D1 in the processing block D2, there are provided a tower T1 extending vertically over the six unit blocks E and a delivery arm 39 which is a vertically movable transfer mechanism for delivering the wafer W to and from the tower T1. The tower T1 includes a plurality of delivery modules TRS stacked one above another. The delivery modules TRS provided at the respective heights of the unit blocks E1 to E3 can deliver the wafer W to and from the respective transfer arms F1 to F3 of the unit blocks E1 to E3.

Towers T2, T3 and T4 are provided in the interface block D3 and vertically extend over the six unit blocks E. Furthermore, there are three interface arms 41, 42 and 43. Interface arm 41 is a vertically movable transfer mechanism for delivering the wafer W to and from the tower T2 and the tower T3, interface arm 42 is a vertically movable transfer mechanism for delivering the wafer W to and from the tower T2 and the tower T4, and interface arm 43 is a transfer mechanism for delivering the wafer W between the tower T2 and the exposure apparatus D4.

The tower T2 is made up of the following stacked one above another: a transfer module TRS, a buffer module for storing and holding a plurality of wafers W before an exposure process, a buffer module for storing a plurality of wafers W after the exposure process, and a temperature adjustment module for adjusting the temperature of the wafers W. However, the illustration of the buffer modules and the temperature adjustment module is omitted. Each of the towers T3 and T4 is also provided with a module to which the wafers W are transferred. However, the description thereof is omitted.

Figure 12:
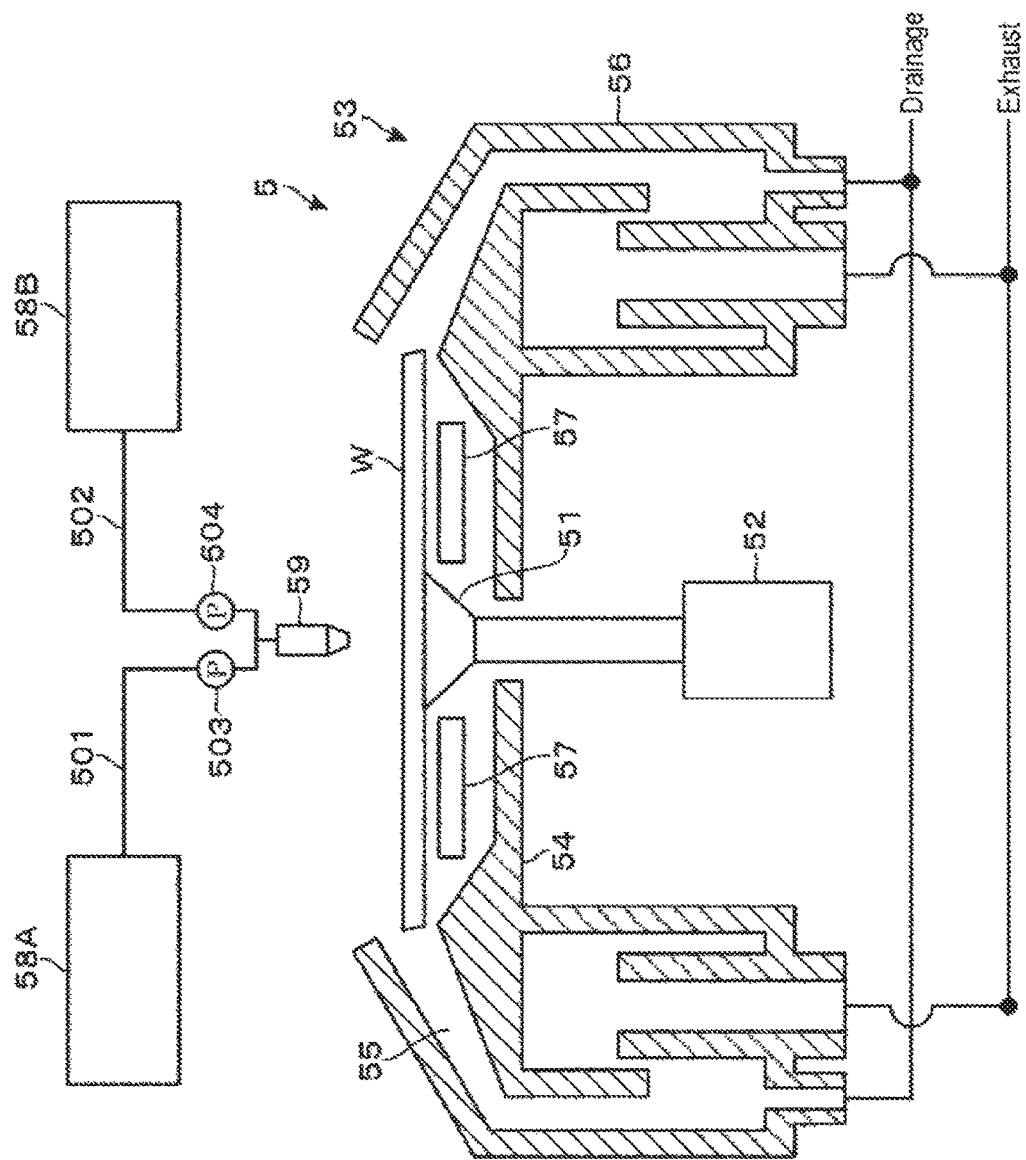
FIG. 12 is a vertical sectional side view of a module for forming a polyurea film, which is provided in the coating/developing apparatus.

The polyurea film forming module 5 will be described with reference to FIG. 12. Reference numeral 51 in FIG. 12 denotes a vacuum chuck which is a mounting table configured to adsorptively hold a wafer W and is rotated by a rotation mechanism 52. Reference numeral 53 denotes a cup module 53. Reference numeral 54 denotes a guide member in which an outer peripheral wall and an inner peripheral wall extending downward are formed in a cylindrical shape. Reference numeral 55 denotes a discharge space formed between an outer cup 56 and the outer peripheral wall so that the exhaust and drainage can be performed over the entire circumference. The lower side of the discharge space 54 has a gas-liquid separable structure. In FIG. 12, reference numeral 57 denotes an LED (light emitting diode) that heats the wafer W, for example, by irradiating the wafer W with light from below. The LED 57 heats the wafer W so that polymerization is performed when a chemical solution is supplied to the wafer W as described later.

A diamine solution (referred to as a first chemical solution) described with reference to FIG. 6 is supplied from a supply source 58A toward a chemical solution nozzle 59, and a diisocyanate solution (referred to as a second chemical solution) described with reference to FIG. 6 is supplied from a supply source 58B toward the chemical solution nozzle 59. These solutions join immediately before being supplied to the chemical solution nozzle 59, thereby forming a mixed solution. That is to say, the first chemical solution and the second chemical solution are mixed just before being supplied to a substrate. Then, the chemical solution nozzle 59 discharges the mixed solution vertically downward. The chemical solution nozzle 59, which is a raw material discharge part, is connected to a driving mechanism (not shown) and is configured to be movable between the central portion of the wafer W and the outside of the outer cup 56.

The processing of the wafer W in the polyurea film forming module 5 will be described. First, the aforementioned mixed solution is supplied to the central portion of the wafer W from the chemical solution nozzle 59 which constitutes a raw material discharge part, and the wafer W is rotated at a predetermined rotation speed, whereby the mixed solution is spread on the surface of the wafer W. That is to say, the first chemical solution and the second chemical solution are respectively spin-coated on the wafer W. Then, the mixed solution is heated on the surface of the wafer W so that the solvent in the solution is removed to form the polyurea film 21.

Film formation may be performed by initially supplying one of the first chemical solution and the second chemical solution to the wafer W and subsequently supplying the other chemical solution to the wafer W. In that case, a diamine-purpose chemical solution nozzle 59 connected to the supply source 58A and a diisocyanate-purpose chemical solution nozzle 59 connected to the supply source 58B may be provided so that chemical solutions are respectively discharged from the respective chemical solution nozzles 59 to the wafer W. Alternatively, as shown in FIG. 12, the first chemical solution and the second chemical solution may be sequentially supplied from the nozzle 59 common to the supply sources 58A and 58B. In that case, any one of the first chemical solution and the second chemical solution may be supplied first.

As described above, the method of supplying the chemical solutions to the wafer W include a method of supplying various chemical solutions to the wafer W by mixing them just before they are supplied to the wafer W and a method of sequentially supplying various chemical solutions to the wafer W. The sequentially supplying includes not only supplying each chemical solution once, but also alternately and repeatedly supplying the respective chemical solutions. Moreover, each of the chemical solution nozzles 59 may be configured to discharge, as a mist, the chemical solutions supplied from the supply sources 58A and 58B to the wafer W. Even in the case where the mist is supplied to the wafer W in this way, the chemical solutions may be mixed just before supplying them to the wafer W, and the mixed solution may be discharged as a mist from the chemical solution nozzle 59. Alternatively, the respective chemical solutions may be sequentially supplied to the chemical solution nozzle 59 and may be discharged as a mist. As described above, the supplying the polymerization liquid to the substrate includes forming a liquid flow to supply the liquid to the substrate and supplying the liquid in as a mist. In supplying the mist to the wafer W, the wafer W may not be rotated and may be in a stopped state. The inorganic film forming module 36, the resist film forming module 37 and the developing module 38 are configured in the same manner as the polyurea film forming module 5, except that the type of the chemical solution to be supplied to the wafer W is different and the LED 57 is not provided.

The reason why the first chemical solution and the second chemical solution are mixed just before being supplied to the wafer W is to prevent polyurea from being formed in the flow path of the chemical solutions before the first chemical solution and the second chemical solution are supplied to the wafer W. The configuration of the polyurea film forming module 5 will be described in more detail. The supply source 58A and the supply source 58B are connected to the chemical solution nozzle 59 via a flow path 501 and a flow path 502, respectively. The supply source 58A and the supply source 58B include tanks in which the first chemical solution and the second chemical solution are respectively stored. Pumps 503 and 504 are provided in the flow paths 501 and 502 for forcibly feeding the respective chemical solutions stored in the supply sources 58A and 58B as described above to the chemical solution nozzle 59. For example, the flow paths 501 and 502 are joined with each other at the downstream side of the pumps 503 and 504 to form a joined path. The downstream end of the joined path is connected to the chemical solution nozzle 59. With this configuration, as described above, a mixed solution can be formed by mixing the first chemical solution and the second chemical solution immediately before supplying them to the wafer W. In the example shown in FIG. 12, the flow paths 501 and 502 are joined at the upstream side of the chemical solution nozzle 59. However, the end portions of the flow paths 501 and 502 may be joined in the chemical solution nozzle 59. In that case, the flow path inside the chemical solution nozzle 59 forms a joined path at the downstream side of the flow paths 501 and 502.

The position where the flow paths 501 and 502 are joined together will be described in more detail. In order to prevent the film thickness uniformity in the plane of the wafer W from being reduced as a polymerization reaction proceeds in the mixed solution of the first chemical solution and the second chemical solution before the chemical solutions are supplied to the wafer W, it is preferable that the position where the flow paths 501 and 502 are joined with each other is in the vicinity of the wafer W. That is to say, the joining position is set as described above to prevent a polymerization reaction from proceeding, as a relatively long time has elapsed from the mixing of the first chemical solution and the second chemical solution to the supply of the mixed solution to the wafer W, and to prevent a polymerization reaction from proceeding as the first chemical solution and the second chemical solution receive heat from the heated wafer W at the joining position of the respective chemical solutions.

More specifically, for example, as described above, the flow paths 501 and 502 are joined together inside the chemical solution nozzle 59 to form a joined flow path extending toward the discharge port of the chemical solution nozzle 59 located at the lower side. That is to say, the first chemical solution and the second chemical solution are mixed inside the chemical solution nozzle 59. The mixed solution of the respective chemical solutions may be discharged by disposing the chemical solution nozzle 59 so as to be spaced apart from the wafer W, so that the upstream end of the joined flow path in the chemical solution nozzle 59 is positioned in the vicinity of the surface of the wafer W, for example, so that the upstream end of the joined flow path is spaced apart upward by, e.g., several cm from the surface of the wafer W. Since the upstream end of the joined flow path is disposed in the vicinity of the wafer W as described above, the influence of the heat radiated from the wafer W is suppressed. The temperature at the upstream end of the joined flow path is lower than the temperature of the wafer W and is, for example, from a temperature (e.g., 23 degrees C.) in a room in which the polyurea film forming module 5 is provided, to 120 degrees C., whereby the progress of a polymerization reaction is suppressed at the upstream end of the joined flow path. Since the upstream end of the joined flow path is provided in the chemical solution nozzle 59 as described above, the chemical solution nozzle 59 is disposed so that the temperature of the chemical solution nozzle 59 is lower than the temperature of the wafer W. Thus, the temperature of the chemical solution nozzle 59 is controlled.

In FIG. 9, reference numeral 30 denotes a control part provided in the coating/developing apparatus 3. The control part 30 includes a program, a memory and a CPU. The program is stored in a computer-readable storage medium, for example, a compact disk, a hard disk, a magneto-optical disk or the like, and is installed on the control part 30. The control part 30 outputs a control signal to each part of the coating/developing apparatus 3 according to the program and controls the operation of each part. Specifically, the program controls the operation of transferring the wafer W between the modules by each transfer mechanism of the coating/developing apparatus 3 and the operation of processing the wafer W in each module. The program incorporates a group of steps so that the series of processes described with reference to FIGS. 2A to 3E are performed with respect to the wafer W.

The transfer path of the wafer W in the system including the coating/developing apparatus 3 and the exposure apparatus D4 will be described. The carrier C that stores the wafer W including the p-MOS formation region 11 and the n-MOS formation region 12 as described with reference to FIGS. 1 and 2A is mounted on the mounting table 31 of the carrier block D1, and is transferred to the delivery module TRS0 of the tower T1 in the processing block D2 by the transfer mechanism 33. The wafer W is transferred by the delivery arm 39 from the delivery module TRS0 to the delivery module TRS1 corresponding to the unit block E1 (the delivery module capable of delivering the wafer W by the transfer arm F1).

Thereafter, the wafer W is transferred by the transfer arm F1 from the delivery module TRS1 to the polyurea film forming module 5. After the polyurea film 21 is formed as shown in FIG. 2B, the wafer W is transferred to the inorganic film forming module 36 and is coated with the chemical solution. Subsequently, the wafer W is transferred to the heating module 35 where the wafer W is heated. The solvent in the chemical solution is vaporized so that the inorganic film 22 is formed as shown in FIG. 2C. Subsequently, the wafer W is transferred to the delivery module TRS1 and is further transferred by the delivery arm 39 to the delivery module TRS2 corresponding to the unit block E2.

Subsequently, the wafer W is transferred from the delivery module TRS2 to the resist film forming module 37 by the transfer arm F2 and is coated with a resist. Then, the wafer W is transferred to the heating module 35, and the solvent in the resist is vaporized so that the resist film 23 is formed as shown in FIG. 3D. Thereafter, the wafer W is transferred to the delivery module TRS21 of the tower T2 and is carried into the exposure apparatus D4 via the tower T3 by the interface arms 41 and 43. The resist film 23 is exposed along a predetermined pattern. The wafer W thus exposed is transported between the towers T2 and T4 by the interface arms 41 and 43, and is transferred to the delivery module TRS31 of the tower T2 corresponding to the unit block E3.

Thereafter, the wafer W is transferred to the heating module 35, by the transfer arm F3, and is subjected to post exposure baking. Then, the wafer W is transferred to the developing module 38 and is supplied with a developing solution. A resist pattern is formed as shown in FIG. 3E. Thereafter, the wafer W is transferred to the delivery module TRS3 corresponding to the unit block E3 of the tower T1, and is returned to the carrier C by the transfer mechanism 33.

Subsequently, the vacuum processing apparatus 6, for performing the series of processes from the formation of a pattern on the inorganic film 22 to the removal of the polyurea film 21, which has been described with reference to FIGS. 3F to 5J, will be described with reference to a plan view of FIG. 13. The vacuum processing apparatus 6 is provided with a horizontally elongated atmospheric pressure transfer chamber 61 whose internal atmosphere is set to an atmospheric pressure atmosphere by, for example, a dry $N_2$ gas. In the front of the atmospheric pressure transfer chamber 61, loading/unloading ports 62 for mounting the carrier C are arranged side by side in the left-right direction. A door 63, to be opened and closed together with the lid of the carrier C, is attached to the front wall of the atmospheric pressure transfer chamber 61. A first transfer mechanism 64 composed of an articulated arm for transferring the wafer W is provided inside the atmospheric pressure transfer chamber 61. Furthermore, at the left side wall, as seen from the side of the loading/unloading ports 62 of the atmospheric pressure transfer chamber 61, an alignment chamber 65 for adjusting the orientation and eccentricity of the wafer W is provided.

At the opposite side of the loading/unloading ports 62 in the atmospheric pressure transfer chamber 61, for example, two load lock chambers 66A and 66B are arranged side by side in the left-right direction. Gate valves 67 are provided between the load lock chambers 66A and 66B and the atmospheric pressure transfer chamber 61. A vacuum transfer chamber 68 is disposed via gate valves 69 at the inner side of the load lock chambers 66A and 66B as viewed from the side of the atmospheric pressure transfer chamber 61.

An etching processing module 7, an etching processing module 70, a doping module (ion implantation module) 8 and a depolymerization module 79 are connected to the vacuum transfer chamber 68 via respective gate valves 6A. The etching processing module 7 and the etching processing module 70 are modules that perform etching processing before ion implantation and etching processing after ion implantation, respectively. A second transfer mechanism 6B, including two transfer arms composed of articulated arms, is provided in the vacuum transfer chamber 68. By the second transfer mechanism 6B, the wafer W is transferred between the load lock chambers 66A and 66B, and the modules connected to the vacuum transfer chamber 68.

Subsequently, the etching processing module 7 will be described with reference to FIG. 14 which is a vertical sectional side view. The etching processing module 7 is configured to generate capacitively-coupled plasma and to perform each of the above-described etching processes. Reference numeral 71 in FIG. 14 denotes a grounded processing container, which is connected to the vacuum transfer chamber 68 via the gate valve 6A described with reference to FIG. 13. The interior of the processing container 71 is evacuated by an evacuation mechanism 72, whereby a vacuum atmosphere of a desired pressure is established inside the processing container 71.

Figure 14:
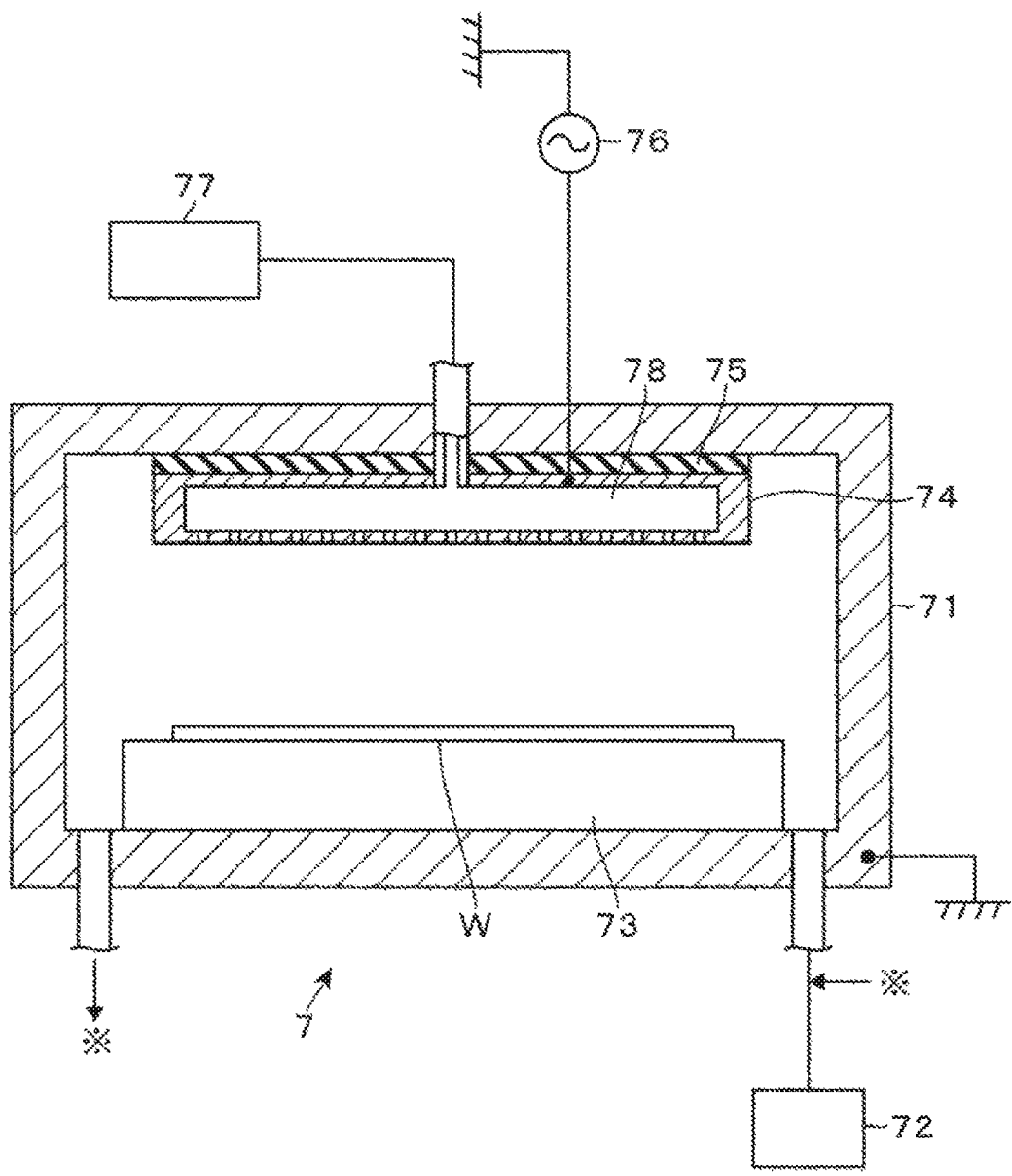
FIG. 14 is a vertical sectional side view of an etching processing module provided in the vacuum processing apparatus.

Reference numeral 73 in FIG. 14 denotes a mounting table on which the wafer W is mounted. A heater (not shown) for heating the wafer W is embedded in the mounting table 73. The mounting table 73 is electrically connected to the bottom surface of the processing container 71. The mounting table 73 serves as a lower electrode and functions as an anode electrode. The mounting table 73 includes lift pins that protrudes and retracts on the surface of the mounting table 73 and supports the rear surface of the wafer W so that the wafer W can be delivered to and from the second transfer mechanism 6B. The lift pins are not shown herein. When describing other modules connected to the vacuum transfer chamber 68, the lift pins are not shown.

A shower head 74 is provided above the mounting table 73 so as to face the upper surface of the mounting table 73. Reference numeral 75 in FIG. 14 denotes an insulating member, which insulates the shower head 74 from the processing container 71. A high frequency power source 76 for plasma generation is connected to the shower head 74. The shower head 74 functions as a cathode electrode.

Reference numeral 77 in FIG. 14 denotes a gas supply part which supplies an etching gas to a diffusion space 78 provided inside the shower head 74. The etching gas supplied to the diffusion space 78 is supplied to the wafer W in a shower shape from the discharge holes of the shower head 74. When the etching gas is supplied to the wafer W in this way, the high frequency power source 76 is turned on. An electric field is formed between the electrodes to convert the etching gas into plasma, whereby the film on the surface of the wafer W is etched.

Figure 3F:
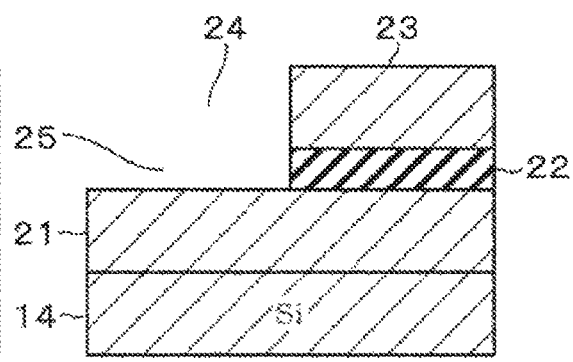

The etching processing module 7 supplies an etching gas for performing the etching described with reference to FIGS. 3F and 4G. The etching processing module 70 supplies an etching gas for performing the etching described with reference to FIG. 4I. Except for the difference in the etching gas supplied to the wafer W in this way, the etching processing module 70 is configured in the same manner as the etching processing module 7.

Next, the depolymerization module 79, which is a removal module for removing the polyurea film 21, will be described. Similar to the etching processing module 7, the depolymerization module 79 includes a processing container 71 connected to the vacuum transfer chamber 68 via the gate valve 6A. The interior of the processing container 71 is kept in a vacuum atmosphere. A mounting table 73 provided with a heater is provided inside the processing container 71. The wafer W mounted on the mounting table 73 is heated to the above-mentioned temperature, whereby the polyurea film 21 is removed by depolymerization. In the depolymerization module 79, for example, an inert gas supply part for supplying an inert gas into the processing container 71 is provided. When the wafer W is heated as described above, the interior of the processing container 71 is kept in an inert gas atmosphere.

Subsequently, the doping module 8 will be described with reference to FIG. 15 which is a vertical sectional side view. Reference numeral 81 in FIG. 15 denotes a grounded processing container which is connected to the vacuum transfer chamber 68 via the gate valve 6A. Reference numeral 82 in FIG. 15 denotes a mounting table for mounting the wafer W thereon. A heater (not shown) for heating the wafer W and an electrode 83 are embedded in the mounting table 82. A high frequency power source 83A for RF (Radio Frequency) bias is connected to the electrode 83 via a matching unit 83B. Reference numeral 84 in FIG. 15 denotes an exhaust port for evacuating the interior of the processing container 81 to bring the interior of the processing container 81 into a vacuum atmosphere having a desired pressure. The doping module 8 is further provided with a first gas supply part 84 for blowing an inert gas for plasma excitation and a doping gas such as a $BF_3$ (boron trifluoride) gas or the like from the upper side toward the center of the wafer W, and a second gas supply part 85 for blowing the inert gas and the doping gas toward the lateral side of the wafer W from the outside thereof.

Figure 15:
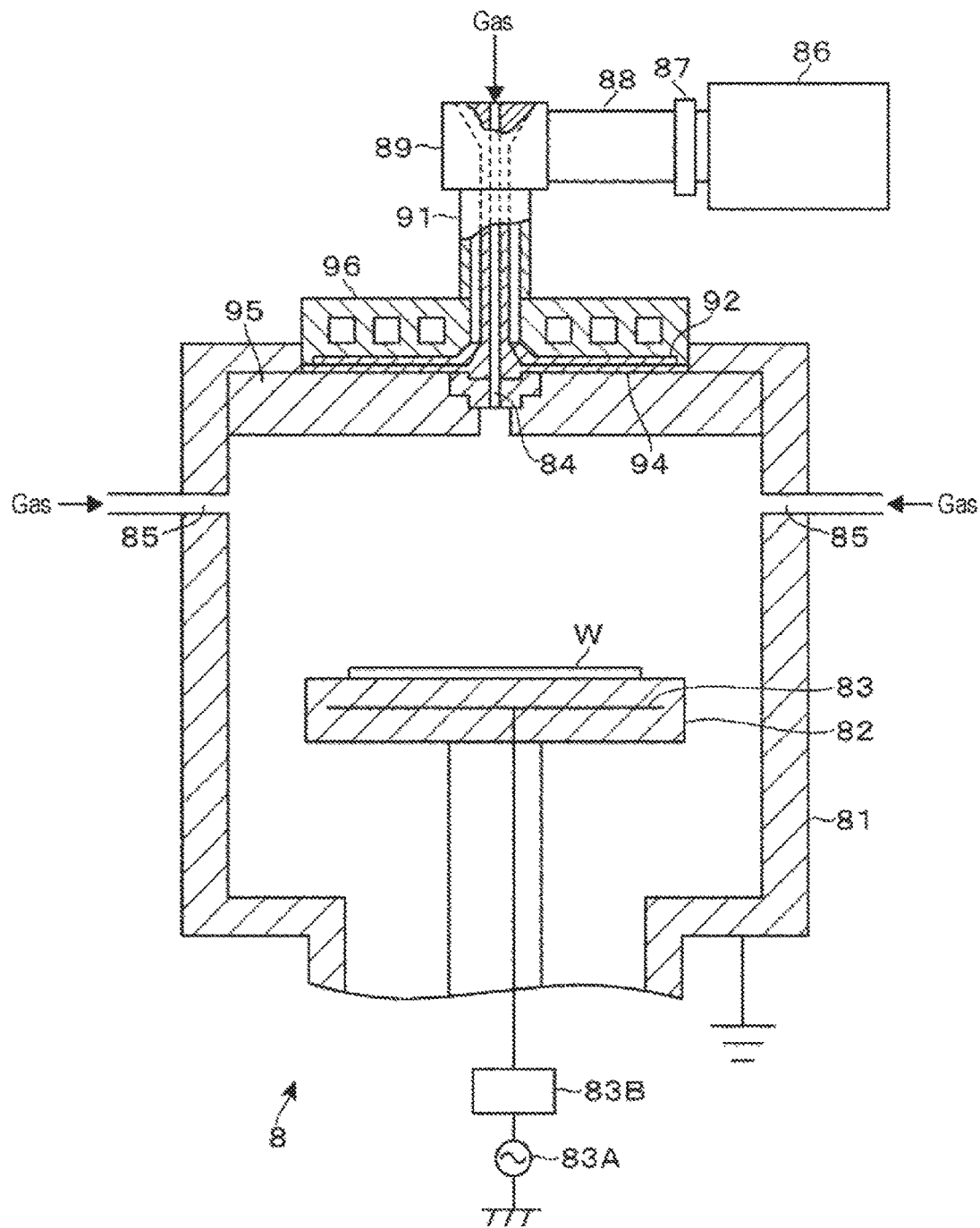
FIG. 15 is a vertical sectional side view of a doping module provided in the vacuum processing apparatus.

Reference numeral 86 in FIG. 15 denotes a microwave generator for generating a microwave for plasma excitation, which is connected to an upper portion of a coaxial waveguide 91 via a matcher 87, a waveguide 88 and a mode converter 89. The mode converter 89 converts a TE mode microwave supplied from the microwave generator 86 to a TEM mode microwave and supplies the TEM mode microwave to the coaxial waveguide 91. The microwave is supplied from the coaxial waveguide 91 to the central portion of a dielectric member 92 constituting the ceiling portion of the processing container 81. The microwave propagates radially through the dielectric member 92. The microwave is radiated to a dielectric window 95 provided under a slot antenna plate 94 to face the mounting table 82, via a plurality of slot holes (through-holes) (not shown) of the slot antenna plate 94 provided under the dielectric member 92. The microwave transmitted through the dielectric window 95 generates an electric field just below the dielectric window 95 so that the gas supplied from the first gas supply part 84 and the second gas supply part 85 into the processing container 81 is converted to plasma. Reference numeral 96 in FIG. 15 denotes a cooling part having a cooling water flow path formed therein. The cooling part 96 adjusts the temperature of the dielectric member 92 or the like.

Radicals and ions contained in the plasma formed just below the dielectric window 95 as described above are drawn into the wafer W mounted on the mounting table 82 to which the bias is applied, whereby doping is performed. Thus, the doping referred to herein includes ion implantation. Ion implantation may be performed using an ion implantation apparatus of a configuration in which a gas or solid vapor is turned into plasma inside an ion source, ions in the plasma are extracted, mass analysis is performed by a mass spectrometer to separate desired ions, and an ion beam formed of the separated ions is irradiated to the wafer W via an acceleration tube.

Figure 13:
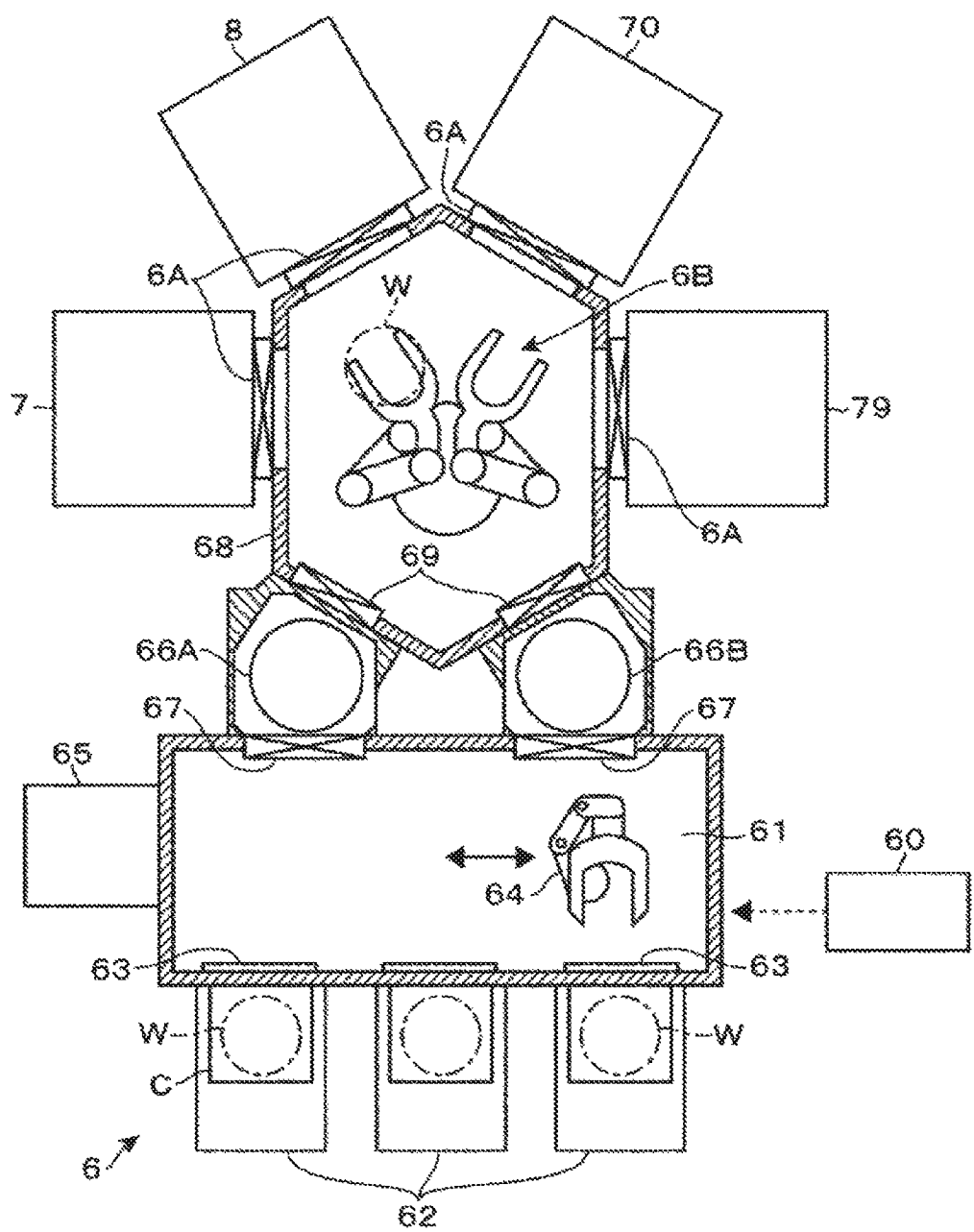
FIG. 13 is a plan view of a vacuum processing apparatus for carrying out the semiconductor device manufacturing method.

As shown in FIG. 13, the vacuum processing apparatus 6 is provided with a control part 60 just like the coating/developing apparatus 3. A control signal is outputted to each part of the vacuum processing apparatus 6 according to a program constituting the control part 60 and stored in a storage medium, whereby the operation of each part is controlled. Specifically, the program controls operations such as the transfer of the wafer W inside the vacuum processing apparatus 6, the supply and cutoff of each gas to the wafer W in each module, the formation of plasma by turning on/off the high frequency power source, the pressure regulation in each module, and the like. The program incorporates a group of steps so that the series of processes described above with reference to FIGS. 3F to 5J are performed with respect to the wafer W.

The operation of the vacuum processing apparatus 6 will be described. For example, when the carrier C receiving the wafers W processed in the coating/developing apparatus 3 is transferred to the vacuum processing apparatus 6 by a transfer mechanism (not shown) and is mounted on the loading/unloading port 62, the wafer W received in the carrier C is taken out by the first transfer mechanism 64. The wafer W is transferred in the order of the atmospheric pressure transfer chamber 61, the alignment chamber 65 and the load lock chamber 66A. Thereafter, the wafer W is transferred in the order of the vacuum transfer chamber 68 and the etching processing module 7 by the second transfer mechanism 6B. Then, as described with reference to FIG. 3F, the inorganic film 22 is etched by the plasma-converted etching gas, for example, a $CF_4$ gas, and a mask pattern is formed on the inorganic film 22. Furthermore, as described with reference to FIG. 4G, the formation of a mask pattern by the etching of the polyurea film 21 and the removal of the resist film 23 are performed by a plasma-converted etching gas, for example, an oxygen gas.

Thereafter, the wafer W is transferred by the second transfer mechanism 6B in the order of the vacuum transfer chamber 68 and the doping module 8, and the ion implantation described with reference to FIG. 4H is performed on the wafer W. Subsequently, the wafer W is transferred by the second transfer mechanism 6B in the order of the vacuum transfer chamber 68 and the etching processing module 70, and the inorganic film 22 is etched and removed by the plasma-converted etching gas such as a $CF_4$ gas or the like as described with reference to FIG. 4I. Thereafter, the wafer W is transferred by the second transfer mechanism 6B in the order of the vacuum transfer chamber 68 and the depolymerization module 79. The wafer W is heated and the polyurea film 21 is depolymerized as shown in FIG. 5J. The raw material monomers are removed by diffusing from the wafer W. Thereafter, the wafer W is transferred by the second transfer mechanism 6B in the order of the vacuum transfer chamber 68 and the load lock chamber 66B, and is returned to the carrier C by the first transfer mechanism 64.

Moreover, the removal of the inorganic film 22 after ion implantation may be performed by wet etching. For example, in the case where the inorganic film 22 is formed of $SiO_2$ or SiOC, an etching solution composed of HF (hydrogen fluoride) may be used for performing wet etching. In addition, the formation of the inorganic film 22 and the polyurea film 21 may not be performed by liquid processing, but may be performed by CVD as described later. However, as described above, the formation of the inorganic film 22 and the polyurea film 21 is performed by liquid processing under an atmospheric pressure atmosphere just like the formation of the resist film 23 to be performed later. By doing so, the series of processes described with reference to FIGS. 2A to 3E can be performed inside the coating/developing apparatus 1. In addition, the removal of the inorganic film 22 is performed by dry etching under a vacuum atmosphere just like the removal of the polyurea film 21 by ion implantation and heating which are processes performed before and after the removal of the inorganic film 22. By doing so, the series of processes described with reference to FIGS. 3F to 5J can be performed inside the vacuum processing apparatus 6. In other words, the coating/developing apparatus 3 and the vacuum processing apparatus 6 are configured to be able to, when performing the processes of FIGS. 2A to 5J, reduce the number of transfers of the carrier C and the wafer W and the number of transfers of the carrier C between the apparatuses, thereby reducing processing time.

Figure 16:
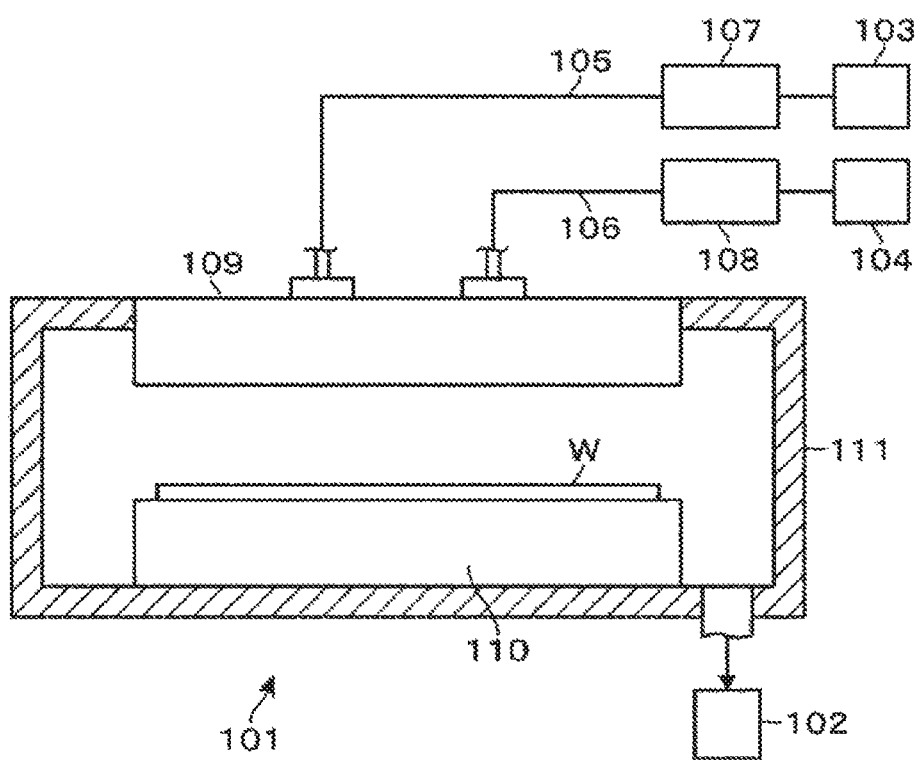
FIG. 16 is a sectional view showing an apparatus for reacting isocyanate and amine with vapor to produce a polymer having a urea bond.

As described above, the polyurea film 21 may be formed by CVD. FIG. 16 shows a CVD module 101 for supplying a gas containing the aforementioned raw material monomers to the wafer W to form a polyurea film 21 by vapor deposition polymerization. Reference numeral 111 in FIG. 16 denotes a vacuum container for defining a vacuum atmosphere. Reference numeral 102 in FIG. 16 denotes an evacuation mechanism for evacuating the interior of the vacuum container 111 to form a vacuum atmosphere. Reference numerals 103 and 104 denote raw material supply sources for storing, in a liquid state, isocyanate and amine which are raw material monomers. The liquid of isocyanate and the liquid of amine are vaporized by vaporizers 107 and 108 installed in supply pipes 105 and 106. The respective vapors are introduced into a shower head 109 which is a gas discharge part.

The shower head 109 has a number of discharge holes formed on its lower surface and is configured to discharge the vapor of isocyanate and the vapor of amine from the separate discharge holes to the processing atmosphere. The wafer W is mounted on a mounting table 110 provided with a temperature adjustment mechanism. The vapor of isocyanate and the vapor of amine are supplied to the wafer W in a state in which the inside of the vacuum container 111 is set to a vacuum atmosphere of a predetermined pressure. The vapor of isocyanate and the vapor of amine are subjected to vapor deposition polymerization on the surface of the wafer W to form the polyurea film 21 described above. The temperature inside the vacuum container 111 when the vapor deposition polymerization is carried out in this manner may be determined according to the kind of raw material monomers and may be, for example, 40 degrees C. to 150 degrees C. For example, when the vapor pressure of the raw material monomers is relatively low, the temperature of the wafer W may be relatively high. For example, when the vapor pressure of the raw material monomers is relatively high, the temperature of the wafer W may be relatively low. As described above, the inorganic film 22 may also be formed using the CVD module 101. The CVD module 101 is connected to, for example, the vacuum transfer chamber 68 of the vacuum processing apparatus 6 just like other modules.

Incidentally, the inorganic film 22 will be supplementarily described. The inorganic film 22 may be a film other than an organic film in which a carbon layer is formed by ion implantation. The inorganic film 22 includes a metal film such as a Cu (copper) film, a Ti (titanium) film, an Al (aluminum) film or the like. A film made of a material different from those of the inorganic film 22 and the polyurea film 21 may be interposed between the inorganic film 22 and the polyurea film 21. In the process described above, the wafer W is transferred in the order of the etching processing module 70 and the depolymerization module 79, and the polyurea film 21 is removed after removing the inorganic film 22. However, the wafer W may be transferred in the order of the depolymerization module 79 and the etching processing module 70, and the inorganic film 22 may be removed after removing the polyurea film 21. If the raw material monomers remain around the wafer W without being diffused from the wafer W at the end of the heating to remove the polyurea film 21, the polyurea film 21 may be formed again from the raw material monomers. If a film is formed on the polyurea film 21, there is a possibility that the diffusion of the raw material monomers is suppressed. In order to reliably remove the polyurea film 21, it is preferred that the inorganic film 22 is first removed and, then, the depolymerization of the polyurea film 21 is performed in a state in which the upper portion of the polyurea film 21 is opened.

The present disclosure may be applied to various ion implantation processes during a semiconductor device manufacturing process, such as the ion implantation to form a source or drain, the formation of a LDD (Lightly Doped Drain), and the like. The present disclosure is not limited to the above-described embodiments. The examples shown in the respective embodiments may be modified as appropriate or may be combined with each other.

[Evaluation Tests]

Hereinafter, evaluation tests conducted in connection with the present disclosure will be described.

Evaluation Test 1

In evaluation test 1, a polyurea film 21 was formed on the surface of a square substrate having one side of 8 cm. The film thickness and the refractive index of the polyurea film 21 were measured. Thereafter, ion implantation was carried out in a state in which the substrate is fixed to the wafer W having a diameter of 300 mm by an adhesive tape. After the ion implantation, the film thickness and the refractive index of the polyurea film 21 were measured. Then, the wafer was heated at 350 degrees C. for 5 minutes or heated at 450 degrees C. for 5 minutes. The state of the polyurea film 21 subjected to the heat treatment was investigated.

The above ion implantation is performed in one of four processing conditions. In evaluation test 1-1, the processing condition was set such that the energy, the dose amount and the dopant are 250 keV, 1E13 cm$^{-2}$ and phosphorus (P), respectively. In evaluation test 1-1, the film thickness and the refractive index of the polyurea film 21 before ion implantation were 471 nm and 1.534, respectively. In evaluation test 1-2, the processing condition was set such that the energy and the dose amount are the same as those of evaluation test 1-1 and the dopant is BF$^3$. In evaluation test 1-2, the film thickness and the refractive index of the polyurea film 21 before ion implantation were 463 nm and 1.532, respectively. In evaluation test 1-3, the processing condition was set such that the energy, the dose amount and the dopant are 10 keV, 1E15 cm$^{-2}$ and phosphorus (P), respectively. In evaluation test 1-3, the film thickness and the refractive index of the polyurea film 21 before ion implantation were 483 nm and 1.534, respectively. In evaluation test 1-4, the processing condition was set such that the energy and the dose amount are the same as those of evaluation test 1-3 and the dopant is BF$^3$. In evaluation test 1-4, the film thickness and the refractive index of the polyurea film 21 before ion implantation were 310 nm and 1.532, respectively.

The following Table 1 summarizes the results of evaluation test 1. In evaluation tests 1-1 and 1-2, the film thickness of the polyurea film 21 was smaller than 50 nm when heat treatment is performed at 350 degrees C., and the polyurea film 21 disappeared when the heat treatment is performed at 450 degrees C. In evaluation tests 1-3 and 1-4, it was not possible to measure the film thickness and the refractive index of the polyurea film 21 after ion implantation. This is because a carbonized layer was formed. When the heat treatment was performed at 350 degrees C., the poly urea film 21 remains on the wafer W in a white turbid state. When the heat treatment was performed at 450 degrees C., the carbonized layer remains as a shell, and the shell is ruptured. That is to say, it was confirmed that the carbonized layer is not removed and becomes a source of particles. From the results of evaluation test 1, it can be noted that the present disclosure is particularly effective when ion implantation is performed at a relatively low energy and a relatively high dose amount as in evaluation tests 1-3 and 1-4. It can also be noted that it is effective to form the inorganic film 22 on the polyurea film 21.

TABLE 1

| | Film thickness of polyurea film after ion implantation | Refractive index of polyurea film after ion implantation | State of polyurea film after heat treatment at 350 degrees C. | State of polyurea film after heat treatment at 450 degrees C. |
|---|---|---|---|---|
| Evaluation test 1-1 | 474 nm | 1.536 | film thickness smaller than 50 nm | disappeared |
| Evaluation test 1-2 | 462 nm | 1.544 | film thickness smaller than 50 nm | disappeared |
| Evaluation test 1-3 | immeasurable | immeasurable | white turbid | carbonized layer ruptured |
| Evaluation test 1-4 | immeasurable | immeasurable | white turbid | carbonized layer ruptured. |

Evaluation Test 2

In evaluation test 2, after a polyurea film 21 was formed on a wafer W, the size of a peak of a specific wavelength (referred to as an initial urea bond peak) indicating the presence of a urea bond in the polyurea film 21 and the size of a peak of a specific wavelength (referred to as an initial CH bond peak) indicating the presence of a CH bond forming a skeleton in the polyurea film 21 were respectively acquired using a Fourier transform infrared spectrophotometer (FT-IR). Thereafter, annealing was performed without performing ion implantation, annealing was performed after performing ion implantation under the same processing condition (the low dose amount and the high energy) as in evaluation test 1-1, or annealing was performed after performing ion implantation under the same processing condition (the high dose amount and the low energy) as in evaluation test 1-3. The case where annealing is performed without performing ion implantation will be referred to as evaluation test 2-1. The case where annealing is performed after performing ion implantation under the same processing condition as in evaluation test 1-1 will be referred to as evaluation test 2-2. The case where annealing is performed after performing ion implantation under the same processing condition as in evaluation test 1-3 will be referred to as evaluation test 2-3. The annealing of evaluation test 2-1 to evaluation test 2-3 was performed for 5 minutes at different temperatures for each wafer W.

Then, with respect to the wafers W subjected to the annealing, the size of a peak of a specific wavelength (post-heating urea bond peak) indicating the presence of a urea bond and the size of a peak of a specific wavelength (post-heating CH bond peak) indicating the presence of a CH bond were respectively acquired using a FT-IR Then, with respect to each wafer W, the maintenance ratio of the peak of the urea bond=the size of the post-heating urea bond peak/the size of the initial urea bond peak×100(%), and the maintenance ratio of the peak of the CH bond=the size of the post-heating CH bond peak/the size of the initial CH bond peak×100(%) were respectively calculated.

The graphs of FIGS. 17 and 18 show the results of evaluation test 3. The horizontal axis in each of the graphs of FIGS. 17 and 18 represents the heating temperature of the wafer W during the annealing process. The vertical axis in the graph of FIG. 17 and the vertical axis in the graph of FIG. 18 represent the maintenance ratio of the urea bond peak and the maintenance ratio of the CH bond peak, respectively. The polyurea film 21 remains in a larger amount as the bond peak maintenance ratios grow larger. In each graph, the result of evaluation test 2-1, the result of evaluation test 2-2 and the result of evaluation test 2-3 are indicated by black square plots, triangular plots and white square plots, respectively.

A comparison of evaluation tests 2-1 and 2-2 shows that in the case of the heating temperature of 300 degrees C., the maintenance ratio of the urea bond peak and the maintenance ratio of the CH bond peak were much higher in evaluation test 2-2 than in evaluation test 2-1. At the heating temperature of 350 degrees C. or higher, the maintenance ratio of the urea bond peak and the maintenance ratio of the CH bond peak were very low in evaluation test 2-2. That is to say, it can be seen that in evaluation test 2-2, the polyurea film 21 including the portion modified by ion implantation can be removed by heat.

However, in evaluation test 2-3, the maintenance ratio of the urea bond peak and the maintenance ratio of the CH bond peak were higher than those of evaluation tests 2-1 and 2-2 in the range where the heating temperature is higher than about 300 degrees C. and not higher than 400 degrees C. In other words, it can be noted that the removal rate of the polyurea film 21 is low. Thus, it can be noted from evaluation test 3 that when only the polyurea film 21 is used as a mask, the carbonized layer is formed and the removal of the polyurea film 21 is suppressed. Although the graphs do not show the result of evaluation test 2-3 conducted at 400 degrees C. or higher, it was confirmed that the carbonized layer is ruptured. Accordingly, similar to evaluation test 1, it was confirmed from evaluation test 2 that it is effective to perform ion implantation by forming the inorganic film 22 on the polyurea film 21.

Evaluation Test 3

The vapor generated by vaporizing H6XDA as amine and the vapor generated by vaporizing H6XDI as isocyanate were supplied to the wafer W to form a polyurea film 21. However, in evaluation test 3, film formation was performed using a CVD apparatus in which each vapor is supplied in the horizontal direction from one end side to the other end side of the wafer W, instead of the CVD module 101 described with reference to FIG. 16. The H6XDA was heated to 85 degrees C. and the vaporization rate thereof was 0.3 g/min. The H6XDI was heated to 110 degrees C. and the vaporization rate thereof was set at 0.1 g/min. The supply of the vapors to the wafer W was performed for 300 seconds, and the pressure inside the vacuum container 101 was set to 0.2 Torr (26.67 Pa). The temperature of the wafer W during the supply of the vapors was changed every processing time and was set at 80 degrees C., 70 degrees C. or 60 degrees C. For the wafer W subjected to film formation, the thickness of the polyurea film 21 formed on each portion in the plane of the wafer W was measured.

When the temperature of the wafer W is 80 degrees C., the average value of the film thickness was 54 nm, the maximum value was 65 nm, the minimum value was 40 nm, and 1σ was 13%. When the temperature of the wafer W is 70 degrees C., the average value of the film thickness was 144 nm, the maximum value was 188 nm, the minimum value was 92 nm, and 1σ was 20%. When the temperature of the wafer W is 60 degrees C. the average value of the film thickness was 297 nm, the maximum value was 468 nm, the minimum value was 142 nm, and 1σ value was 34%. As described above, it was confirmed from evaluation test 3 that the polyurea film 21 can be formed by supplying the vapor of amine and the vapor of isocyanate to the wafer W.

Evaluation Test 4

A first chemical solution was prepared by adding H6XDA as amine to acetone, and a second chemical solution was prepared by adding H6XDI as isocyanate to acetone. Immediately after a mixed solution is prepared by mixing these chemical solutions with each other, the mixed solution was spin-coated on a substrate rotating at 1,500 rpm. Then, the weight and the film thickness of the film thus formed were measured. The concentrations of H6XDA and H6XDI in the first and second chemical solutions were changed every coating time. A mixed solution was prepared by mixing the first chemical solution and the second chemical solution of the same concentration.

As a result of the above test, when the concentration was 20 wt %, the weight was 7.7 mg and the film thickness was 3.6 μm. When the concentration was 5 wt %, the weight was 1.7 mg and the film thickness was 0.7 μm. When the concentration was 2.5 wt/o, the weight was 1.1 mg and the film thickness was 0.5 μm. When the concentration was 2.0 wt %, the weight was 0.8 mg and the film thickness was 0.3 μm. When the concentration was 1.0 wt %, the weight was 0.3 mg and the film thickness was 0.1 μm. It was confirmed from the result of evaluation test 4 that a polyurea film can be formed by spin coating.

According to the present disclosure, a first mask film made of a polymer having a urea bond and a second mask inorganic film laminated on the first mask film are formed on the surface of a substrate. Ion implantation is performed on the surface of the substrate via a pattern formed in the mask films. It is possible for the inorganic film to prevent a carbonized layer from being formed in the first mask film at the time of ion implantation. The first mask film can be removed by heating. Accordingly, there is no need to expose the substrate to a harsh environment. This makes it possible to prevent the substrate from being damaged when removing each mask.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method comprising:
    forming a first mask film composed of a polymer having a urea bond by supplying a raw material to a surface of the substrate for polymerization;
    forming a second mask inorganic film to be laminated on the first mask film;
    forming a pattern on the first mask film and the second mask inorganic film and performing an ion implantation on the surface of the substrate;
    removing the second mask inorganic film after the ion implantation; and
    removing the first mask film by heating the substrate after the ion implantation and depolymerizing the polymer,
    wherein the removing the first mask film is performed by heating the substrate to a temperature of 300 degrees C. to 450 degrees C.

2. The method of claim 1, wherein the forming a pattern on the first mask film and the second mask inorganic film includes laminating a resist film on the second mask inorganic film, subsequently forming the pattern on the resist film, transferring the pattern of the resist film to the first mask film and the second mask inorganic film, and removing the resist film before the ion implantation is performed.

3. The method of claim 1, wherein the second mask inorganic film is a film containing silicon.

4. The method of claim 1, wherein the forming a first mask film includes supplying a vapor of isocyanate and a vapor of amine to the substrate and allowing the isocyanate and the amine to be subjected to a polymerization reaction by heating the substrate.

5. The method of claim 1, wherein the forming a first mask film includes supplying a liquid of isocyanate and a liquid of amine to the substrate and allowing the isocyanate and the amine to be subjected to a polymerization reaction on the surface of the heated substrate.

6. The method of claim 5, wherein the supplying a liquid of isocyanate and a liquid of amine to the substrate includes:
    supplying the liquid of isocyanate to a first flow path from a first supply source in which the liquid of isocyanate is stored;
    supplying the liquid of amine to a second flow path from a second supply source in which the liquid of amine is stored; and
    supplying the liquid of isocyanate and the liquid of amine to a joined flow path formed by joining a downstream side of the first flow path and a downstream side of the second flow path, mixing the liquid of isocyanate and the liquid of amine and discharging the liquid of isocyanate and the liquid of amine to the substrate from a nozzle.

7. A substrate processing apparatus, comprising:
a first film forming part configured to form a first mask film composed of a polymer having a urea bond on a surface of a substrate;
a second film forming part configured to form a second mask inorganic film so as to be laminated on the first mask film;
a third film forming part configured to form a resist film so as to be laminated on the second mask inorganic film;
a heating part configured to heat the substrate after the resist film is exposed;
a developing part configured to develop the heated substrate; and
a transfer mechanism configured to transfer the substrate between respective parts for processing the substrate,
wherein the first film forming part includes a mounting table on which the substrate is mounted, and a raw material discharge part configured to supply a polymerization liquid to the substrate mounted on the mounting table.

8. The apparatus of claim 7, wherein the first film forming part includes a raw material discharge part for isocyanate configured to supply an isocyanate as a first liquid to the substrate, and a raw material discharge part for amine configured to supply an amine as a second liquid to the substrate.

9. A vacuum processing apparatus, comprising:
an ion implantation module configured to implant, in a vacuum atmosphere, ions into a substrate in which a first mask film composed of a polymer having a urea bond and a second mask inorganic film laminated on the first mask film are formed and in which a mask pattern is formed on each of the first mask film and the second mask inorganic film;
an etching processing module configured to supply an etching gas to the substrate to remove the second mask inorganic film in the vacuum atmosphere after the ion implantation; and
a removal module configured to remove the first mask film by heating the substrate in the vacuum atmosphere, after the ion implantation, and depolymerizing the polymer.

10. The apparatus of claim 9, further comprising:
a first vacuum container constituting the ion implantation module, and a second vacuum container, different from the first vacuum container, constituting at least one of the etching processing module and the removal module;
a transfer mechanism configured to transfer the substrate between the first vacuum container and the second vacuum container.

* * * * *